(12) United States Patent
Abdel-Haleem et al.

(10) Patent No.: US 9,018,988 B2
(45) Date of Patent: Apr. 28, 2015

(54) METHODS AND ARCHITECTURES FOR EXTENDED RANGE ARBITRARY RATIO DIVIDERS

(71) Applicant: MEMS Vision LLC, Cairo (EG)

(72) Inventors: Muhammad Swilam Abdel-Haleem, Cairo (EG); Rania Hassan Mekky, Cairo (EG)

(73) Assignee: MEMS Vision LLC, Cairo (EG)

(*) Notice: Subject to any disclaimer, the term of this patent is extended or adjusted under 35 U.S.C. 154(b) by 78 days.

(21) Appl. No.: 13/865,386

(22) Filed: Apr. 18, 2013

(65) Prior Publication Data

US 2014/0312936 A1 Oct. 23, 2014

(51) Int. Cl.
*H03B 19/00* (2006.01)
*H03L 7/00* (2006.01)

(52) U.S. Cl.
CPC ........................................ *H03L 7/00* (2013.01)

(58) Field of Classification Search
USPC ............................... 377/47–48; 327/115, 117
See application file for complete search history.

(56) References Cited

U.S. PATENT DOCUMENTS

| | | | | |
|---|---|---|---|---|
| 7,298,810 B2 * | 11/2007 | Ke | ..................................... | 377/48 |
| 7,760,844 B2 * | 7/2010 | Ding et al. | ....................... | 377/47 |
| 8,552,770 B2 * | 10/2013 | Cavin | ............................. | 327/115 |

OTHER PUBLICATIONS

Vaucher et al., "A Family of Low-Power Truly Modular Programmable Dividers in Standard 0.35um CMOS Technology", IEEE J. Solid-State Circuits, vol. 35, No. 7, pp. 1039-1045.
Riley et al., "Delta-Sigma Modulation in Fraction-N Frequency Synthesis", IEEE J. Solid-State Circuits, vol. 28, pp. 553-559.
Vaucher et al., "A Wide-Band Tuning System for Fully Integrated Satellite Receivers", IEEE J. Solid-State Circuits, vol. 33, pp. 987-997.
Vaucher, "An Adaptive PLL Tuning System Architecture Combining High Spectral Purity and Fast Settling Time", IEEE J. Solid-State Circuits, vol. 35, pp. 490-502.
Rogers et al., "Integrated Circuit Design for High-Speed Frequency Synthesis", Artech House Microwave Library, 2006.
Eissa et al., "A Technique for Robust Division Ratio Switching in Multi Modulus Dividers with Modulus Extension", 22nd Int. Conf. Microelectronics, Oct. 2010, pp. 84-87.
Vaucher et al., "A Low-Power Truly Modular 1.8GHz Programmable Divider in Standard CMOS Technology", Proc. 25th Eur. Solid-State Circuits Conf., Sep. 1999, pp. 406-409.

* cited by examiner

*Primary Examiner* — Quan Tra
(74) *Attorney, Agent, or Firm* — The Law Office of Michael E. Kondoudis

(57) ABSTRACT

One of the most important RF building blocks today is the frequency synthesizer, or more particularly the programmable frequency divider (divider). Such dividers preferably would support unlimited range with continuous division without incorrect divisions or loss of PLL lock. The inventors present multi-modulus dividers (MMDs) providing extended division range against the prior art and without incorrect divisions as the division ratio is switched back and forth across the boundary between two different ranges. Accordingly, the inventors present MMD frequency dividers without the drawbacks within the prior art.

18 Claims, 25 Drawing Sheets

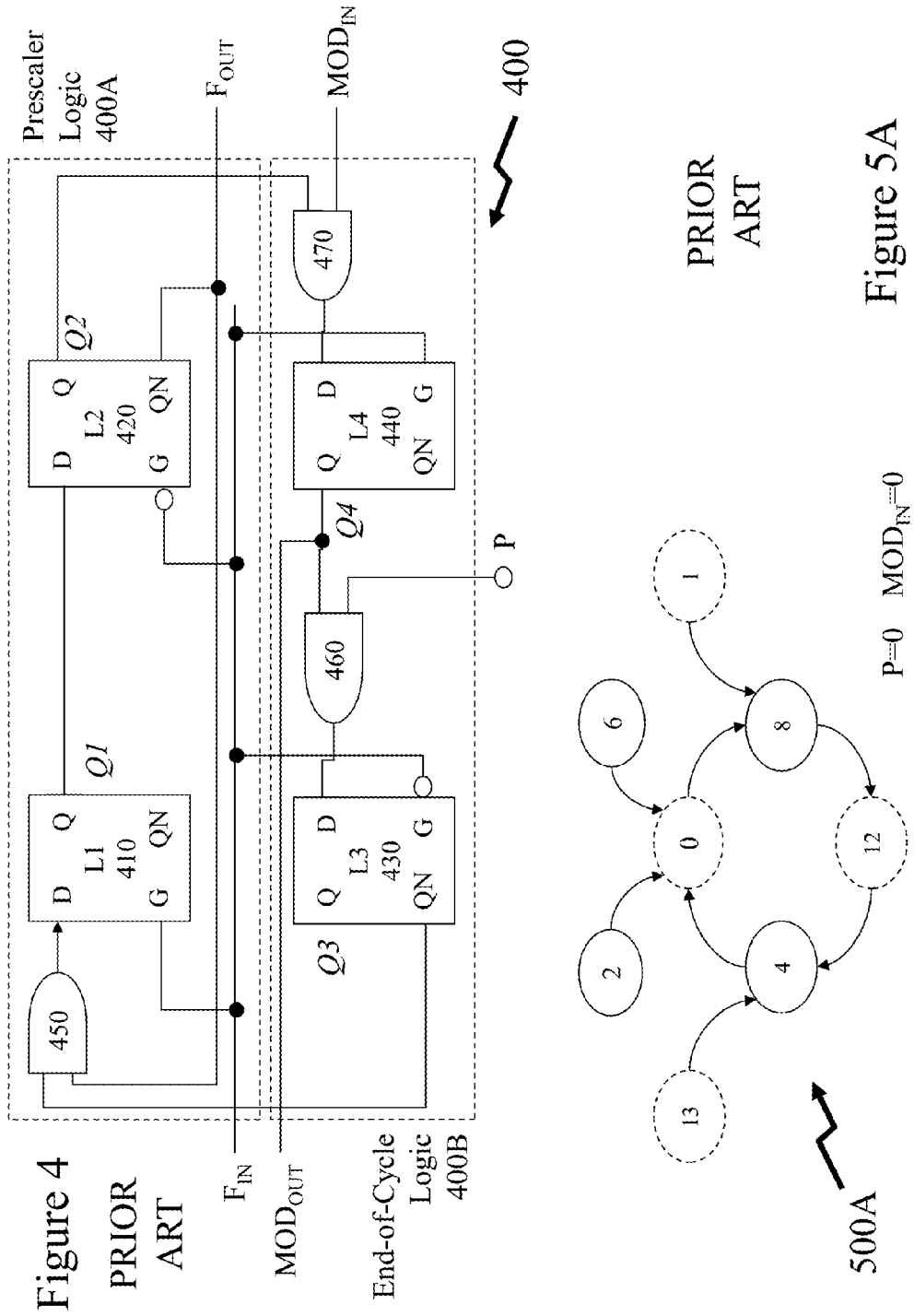

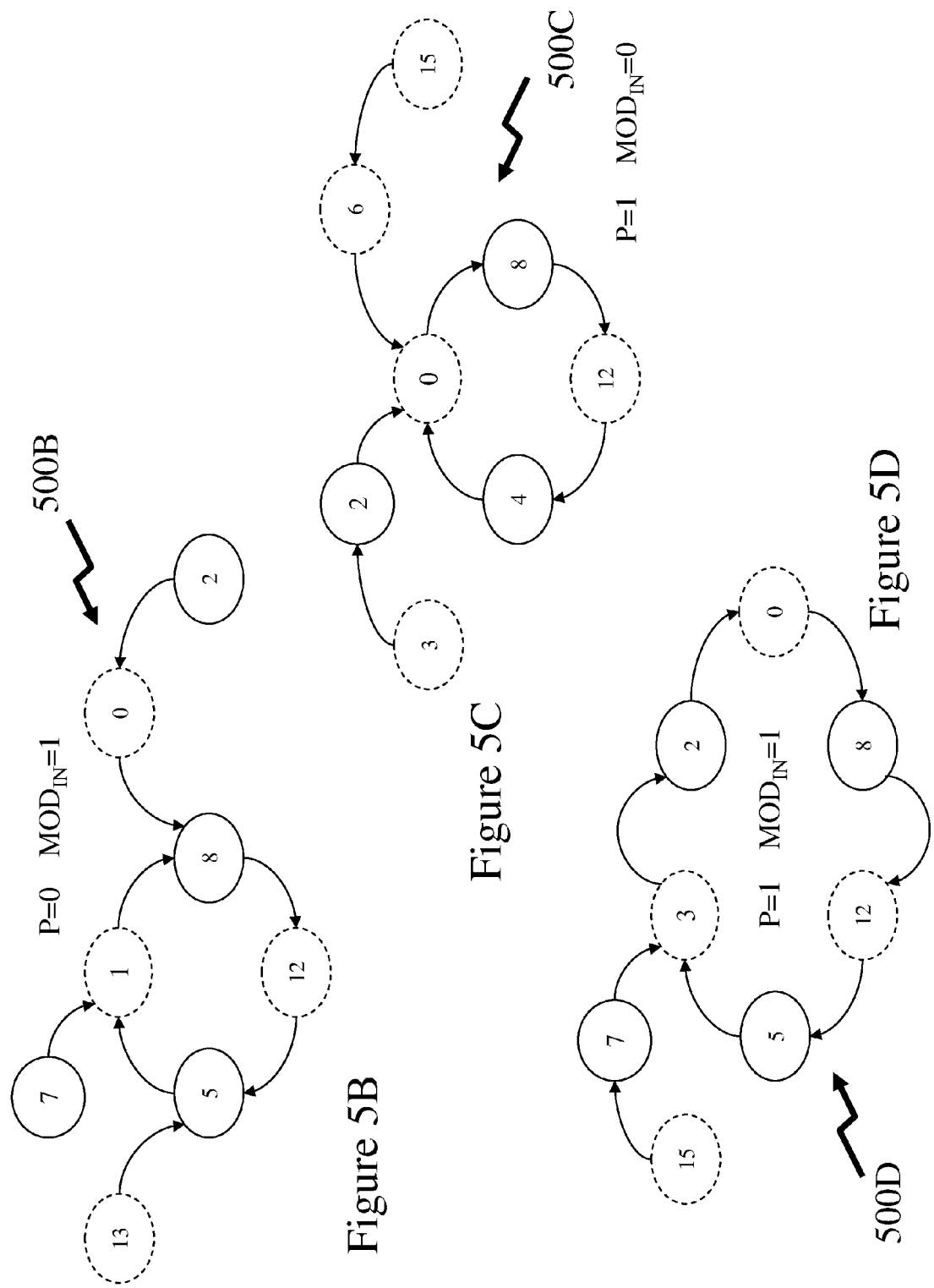

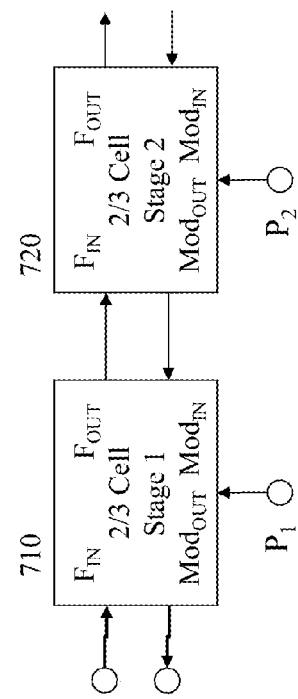
Figure 7
PRIOR ART
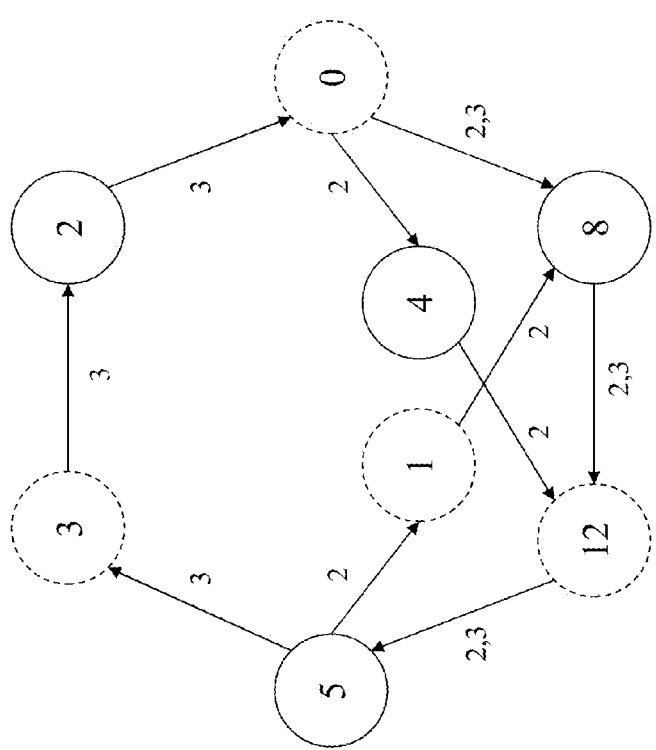
Figure 9
PRIOR ART
Figure 6
PRIOR ART

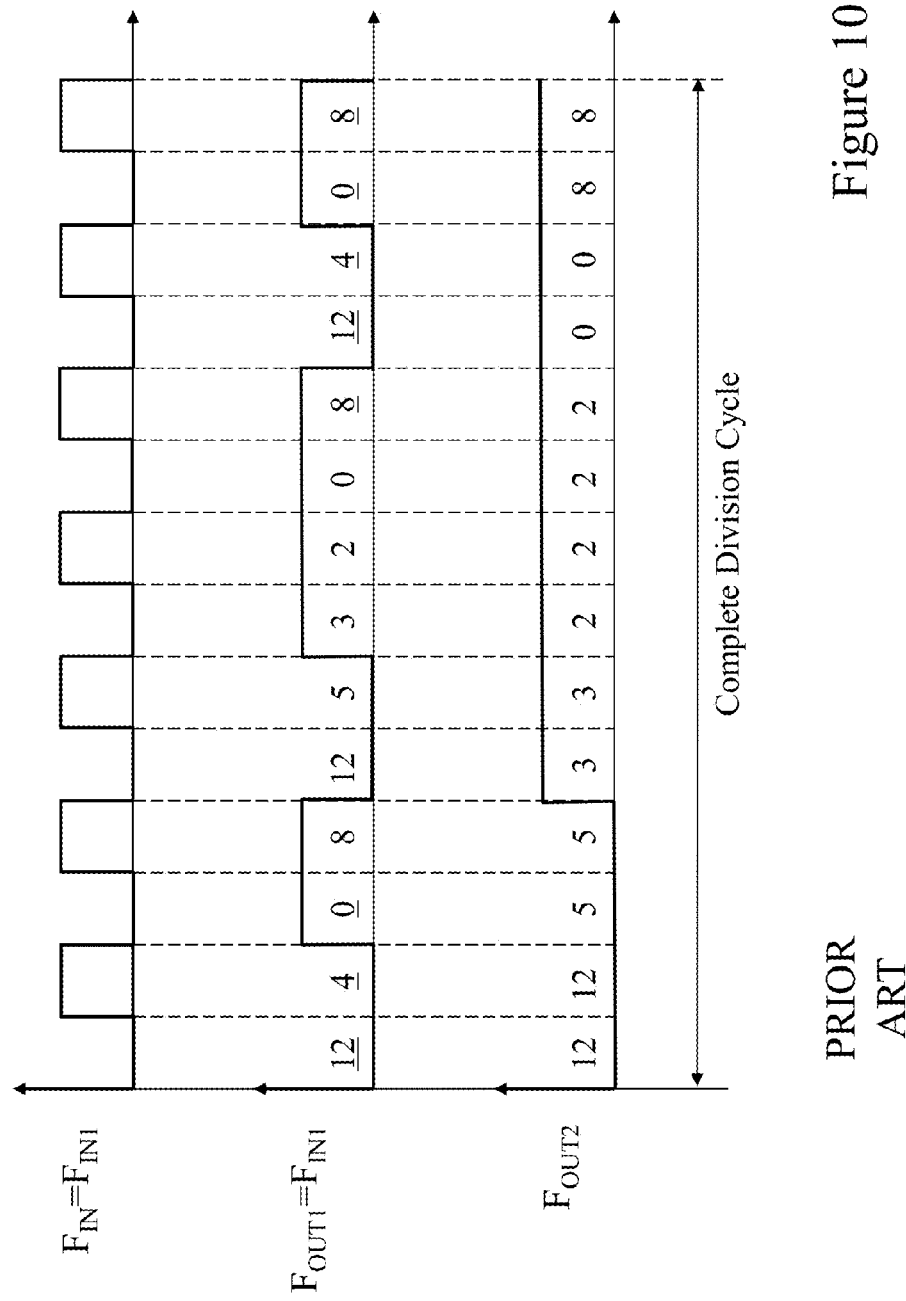

1200

PRIOR ART

1300
PRIOR ART

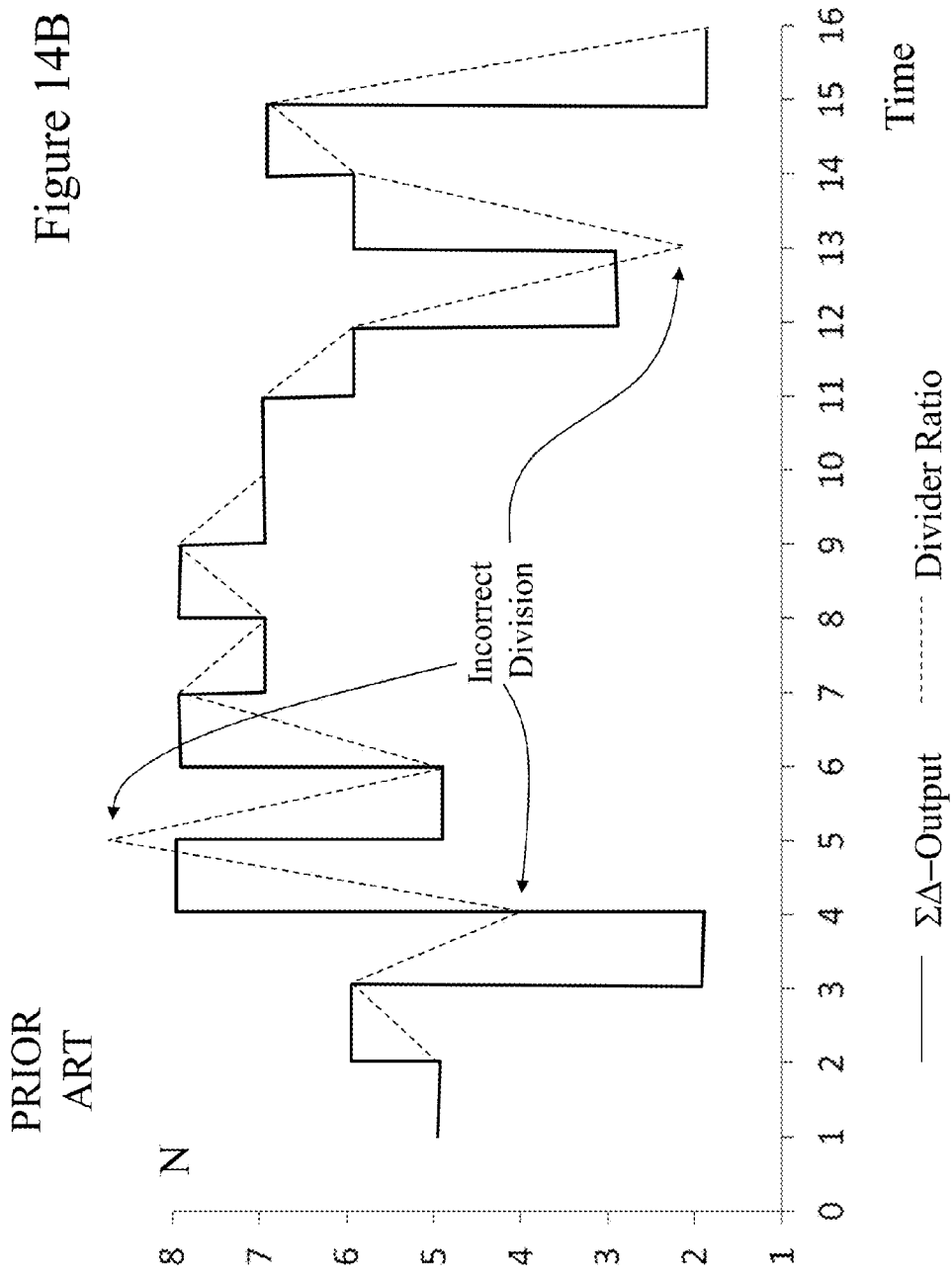

METHODS AND ARCHITECTURES FOR EXTENDED RANGE ARBITRARY RATIO DIVIDERS

FIELD OF THE INVENTION

The present invention relates to frequency dividers and more particularly to providing fractional dividers and resettable dividers without erroneous conversion.

BACKGROUND OF THE INVENTION

One of the most important RF building blocks today is the frequency synthesizer, or more particularly the programmable frequency divider. A frequency synthesizer is an electronic system for generating any range of frequencies from a single fixed time base or oscillator. They are found in a wide variety of electronic systems across multiple applications from high volume low cost consumer devices to low volume high performance military systems. Frequency synthesizers may be found for example within radio receivers, mobile telephones, cellular based smartphones, wireless gaming consoles, satellite receivers, and Global Positioning Systems (GPS). Typically, three types of synthesizer are commonly distinguished of which the first and second types are routinely found as stand-alone architectures, these being Direct Analog Synthesis (DAS), also called a mix-filter-divide architecture, and Direct Digital Synthesizer (DDS). The third type and the most commonly found in communication system integrated circuit (IC) building-blocks are indirect digital phase-locked loop (PLL) synthesizers which are based upon integer-N and fractional-N techniques.

A PLL is a feedback control system which compares the phases of two input signals and produces an error signal that is proportional to the difference between their phases. This error signal is low pass filtered and used to drive a voltage-controlled oscillator (VCO) which creates an output frequency. The output frequency is fed through a frequency divider back to the input of the system, thereby producing a negative feedback loop. If the output frequency drifts, the phase error signal will increase, driving the frequency in the opposite direction so as to reduce the error. Thus the output is locked to the frequency at the other input which is usually derived from a crystal oscillator and therefore a source very stable in frequency. Accordingly, frequency dividers may be deployed both to reduce the crystal oscillator frequency for use as the reference and within the feedback loop.

In either instance the ability of a frequency synthesizer to generate multiple frequencies, and thereby provide RF circuits with the ability to transmit/receive on multiple frequencies is the programmable frequency divider. This is usually in the form of a digital counter, with the output signal acting as a clock signal wherein the counter is preset to some initial count value, and counts down at each cycle of the clock signal. When it reaches zero, the counter output changes state and the count value is reloaded. Such circuits are straightforward to implement using flip-flops which are digital in nature and easy to interface to other digital components or a microprocessor. This allows the frequency output of a synthesizer to be easily controlled by a digital system.

However, the frequency divider consists of logic gates that operate at, or close to, the highest RF frequency as it is driven by the oscillator which has the highest speed in the RF circuit. Accordingly, the divider's complexity and high operating frequency, normally leads to high power dissipation wherein optimizations are typically beneficial and difficult to attain. However, one of the most crucial aspects of the present-day consumer electronics industry is the short time available for the development of new products to potentially their global dominance of a market. These short time-to-market product demands require IC designers to employ architectures that provide easy optimization for power dissipation, fast design times and simple layout integration, see for example Vaucher et al "A Family of Low-Power Truly Modular Programmable Dividers in Standard 0.35 μm CMOS Technology" (IEEE J. Solid-State Circuits, Vol. 35(7), pp 1039-1045, hereinafter Vaucher1).

High reusability, in turn, requires an architecture that provides easy adaptation of the input frequency range and of the maximum and minimum division ratios of existing designs to the new application requirements. Accordingly, the selection of the divider architecture is therefore important for achieving these desirable characteristics of low-power dissipation, high design flexibility and high reusability of existing building blocks. Within the prior art probably the most popular and widely exploited architecture is the Dual-Modulus Prescaler (DMP) based architecture which overcomes the problem of generating narrowly-spaced frequencies that are nevertheless too high to be passed directly through the feedback loop of the system wherein there are two separate frequency divisors employable, usually M and M+1. Whilst the DMP is easily implemented it cannot generally synthesize all the required frequencies and its programmability is further limited if a delta-sigma ($\Delta\Sigma$) noise shaper is designed within the fractional-N synthesizer, where the instantaneous division ratio varies around the average correct division ratio. Therefore, a Multi-Modulus Divider (MMD) architecture which extends the DMP is desirable within the $\Delta\Sigma$ fractional-N frequency synthesis. An alternative prior approach is the Pulse Swallow Divider (PSD) wherein a prescaler, for example a DMP initially divides the input frequency, $F_{in}$, by N+1 or N based on a modulus control, wherein the prescaler output is divided by both a swallow counter which divides the prescaler output by a programmable factor S in feeding back to the prescaler and by a program counter at a fixed rate P to generate the output frequency, $F_{out}$. Accordingly, $F_{out}=(F_{in}/(NP+S))$.

However, these dividers whilst offering benefits over DMP also have disadvantages which vary according application. For example, in many applications the frequency divided signal should have a duty cycle of approximately fifty percent so that it emulates a clock signal at the divided frequency whilst in other applications the divided frequency should have low jitter with respect to the high frequency input signal $F_{in}$ or be capable to supporting unlimited range with either non-continuous or, preferably, continuous division. Within the prior art focus has been placed to the earlier issues such as clock frequency, accumulated clock jitter, and non-continuous division ratio setting rather than extending range and providing pseudo-continuous or continuous division.

Accordingly, the inventors present initially a modified MMD which provides extended division range against the prior art and provides pseudo-continuous division and show that this still yields an incorrect division when the division ratio is switched back and forth across the boundary between more than two different ranges. The inventors also present an extension of these concepts that remove this issue and provides for a continuous division over more than two extended ranges. Accordingly, embodiments of the invention presented by the inventors solve the whole continuous division extended range problem and provide for MMD frequency dividers with no drawbacks.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate drawbacks in the prior art with respect to frequency dividers and more particularly to providing fractional dividers and resettable dividers without erroneous conversion In accordance with an embodiment of the invention there is provided a method comprising:

providing a first predetermined plurality of first dual modulus division stages, each first dual modulus division stage according to a first design supporting frequency division of a signal applied to it by proceeding through a sequence of states relating to the modulus division selected;

providing a second predetermined plurality of second dual modulus division stages, each second dual modulus division stage according to a second design supporting frequency division of a signal applied to it by proceeding through a sequence of states relating to the modulus division selected and providing a separate occurrence indication for each occurrence of at least first and second predetermined state in the sequence of states;

providing a range determination circuit for receiving a plurality of power series coefficients relating to a division factor and generating in dependence upon at least the plurality of coefficients a range signal for each second dual modulus division stage of the second predetermined plurality of second dual modulus division stages, the range signal at least one of freezing and unfreezing the second predetermined dual modulus division stage of the plurality of second dual modulus division stages;

providing between adjacent pairs of the second dual modulus division stage of the plurality of second dual modulus division stages a first logic circuit for receiving at least a predetermined coefficient of the plurality of power series coefficients and a modulus output of the second dual modulus division stage of the adjacent pair dividing the output of the other second dual modulus division stage of the adjacent pair to generate a modulus input to the other second dual modulus division stage of the adjacent pair;

providing a clock activation circuit for receiving a plurality of powers relating to a division factor and generating in dependence upon at least the plurality of powers a clock activation signal for each second dual modulus division stage of the second predetermined plurality of second dual modulus division stages except the last second dual modulus division stage of the second predetermined plurality of second dual modulus division stages;

providing between the adjacent pairs of the second dual modulus division stage of the plurality of second dual modulus division stages a second logic circuit for receiving at least a predetermined clock activation signal, the indication of an occurrence of the first predetermined state from the second dual modulus division stage of the adjacent pair dividing the output of the other second dual modulus division stage of the adjacent pair, and the indication of an occurrence of the second predetermined state from the other second dual modulus division stage of the adjacent pair to generate a clock decision of a plurality of clock decisions; and providing a clock division circuit receiving the plurality of clock decisions to generate a control signal for at least an external circuit.

In accordance with an embodiment of the invention there is provided a method comprising:

providing a dual modulus divider cell comprising at least four latches for generating a frequency divided output of an input signal coupled to the dual modulus divider cell and a modulus output in dependence upon at least a state of the dual modulus divider cell a modulus input signal, the state of the dual modulus divider cell being at least one of dividing by an integer N and dividing by an integer N+1, each latch of the four latches comprising at least one of a set input and a reset input in addition to the dual inputs and dual outputs;

providing a power series coefficient input to the dual modulus divider cell for controlling an aspect of the dual modulus divider cell;

providing a range input to the dual modulus divider cell, the range input being coupled to the at least one of a set input and a reset input of each of the latches;

providing a first occurrence indicator relating to a state of the dual modulus divider cell, the first occurrence indicator being generated in dependence upon a logical AND operation to a first predetermined output of each latch of the four latches; and providing a second occurrence indicator relating to a state of the dual modulus divider cell, the first occurrence indicator being generated in dependence upon a logical AND operation to a second predetermined output of each latch of the four latches.

In accordance with an embodiment of the invention there is provided a device comprising:

a first predetermined plurality of first dual modulus division stages, each first dual modulus division stage according to a first design supporting frequency division of a signal applied to it by proceeding through a sequence of states relating to the modulus division selected;

a second predetermined plurality of second dual modulus division stages, each second dual modulus division stage according to a second design supporting frequency division of a signal applied to it by proceeding through a sequence of states relating to the modulus division selected and providing a separate occurrence indication for each occurrence of at least first and second predetermined state in the sequence of states;

a range determination circuit for receiving a plurality of power series coefficients relating to a division factor and generating in dependence upon at least the plurality of coefficients a range signal for each second dual modulus division stage of the second predetermined plurality of second dual modulus division stages, the range signal at least one of freezing and unfreezing the second predetermined dual modulus division stage of the plurality of second dual modulus division stages;

a first logic circuit disposed between adjacent pairs of the second dual modulus division stage of the plurality of second dual modulus division stages, each first logic circuit for receiving at least a predetermined coefficient of the plurality of power series coefficients and a modulus output of the second dual modulus division stage of the adjacent pair dividing the output of the other second dual modulus division stage of the adjacent pair to generate a modulus input to the other second dual modulus division stage of the adjacent pair;

a clock activation circuit for receiving a plurality of powers relating to a division factor and generating in dependence upon at least the plurality of powers a clock activation signal for each second dual modulus division stage of the second predetermined plurality of second dual modulus division stages except the last second dual modulus division stage of the second predetermined plurality of second dual modulus division stages;

a second logic circuit disposed between the adjacent pairs of the second dual modulus division stage of the plurality of second dual modulus division stages, each second logic circuit for receiving at least a predetermined clock activation signal, the indication of an occurrence of the first predetermined state from the second dual modulus division stage of the adjacent pair dividing the output of the other second dual modulus division stage of the adjacent pair, and the indication of an occurrence of the second predetermined state from the other second dual modulus division stage of the adjacent pair to generate a clock decision of a plurality of clock decisions; and a clock division circuit receiving the plurality of clock decisions to generate a control signal for at least an external circuit.

In accordance with an embodiment of the invention there is provided a device comprising:

a dual modulus divider cell comprising at least four latches for generating a frequency divided output of an input signal coupled to the dual modulus divider cell and a modulus output in dependence upon at least a state of the dual modulus divider cell a modulus input signal, the state of the dual modulus divider cell being at least one of dividing by an integer N and dividing by an integer N+1, each latch of the four latches comprising at least one of a set input and a reset input in addition to the dual inputs and dual outputs;

a power series coefficient input to the dual modulus divider cell for controlling an aspect of the dual modulus divider cell;

a range input to the dual modulus divider cell, the range input being coupled to the at least one of a set input and a reset input of each of the latches;

a first occurrence indicator relating to a state of the dual modulus divider cell, the first occurrence indicator being generated in dependence upon a logical AND operation to a first predetermined output of each latch of the four latches; and a second occurrence indicator relating to a state of the dual modulus divider cell, the first occurrence indicator being generated in dependence upon a logical AND operation to a second predetermined output of each latch of the four latches.

In accordance with an embodiment of the invention there is provided a method comprising providing a multi-modulus divider comprising a plurality of dual modulus divider stages and operating the multi-modulus divider between two division factors without a division error arising from the transition across boundaries of at least two dual modulus divider stages in order to change the divider from the first division factor to the second division factor.

In accordance with an embodiment of the invention there is provided a method comprising:

providing a phase locked loop comprising at least a programmable oscillator under frequency control from a control circuit, a phase detector providing a control signal to the control circuit in dependence upon at least a comparison of a feed-back representation of the oscillator output with a reference frequency;

providing a multi-modulus divider comprising a plurality of dual modulus divider stages within the feed-back loop for dividing the oscillator output by a predetermined division factor; and operating the multi-modulus divider between two division factors without a division error arising from the transition across boundaries of at least two dual modulus divider stages in order to change the divider from the first division factor to the second division factor.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 4 depicts a block diagram of a 2/3 cell according to the prior art;

FIGS. 5A through 5D depict state diagrams for all valid states under different combinations of inputs to the 2/3 cell depicted in FIG. 4;

FIG. 6 depicts a combined state diagram for all possible division cycle of a 2/3 cell as depicted in FIG. 4;

FIG. 7 depicts a cascaded pair of 2/3 cells;

FIG. 9 depicts the state diagram for the division cycle of division ratio 4 for the cascaded 2/3 cell pair of FIG. 7;

FIG. 10 depicts the timing diagram of input frequency of the cascaded 2/3 cell pair of FIG. 7 for a division of 7;

FIG. 14B depicts the unsuccessful operation of the MMD exploiting the cascaded pair of 2/3 cells under the extended range operation with the division change of 7 to 2 as presented in FIG. 14A;

DETAILED DESCRIPTION

The present invention is directed to frequency dividers and more particularly to providing fractional dividers and resettable dividers without erroneous conversion.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

1. Divider Architectures Based on a Dual-Modulus Prescaler

1A. The Multi Modulus Divider

Figure 1A:
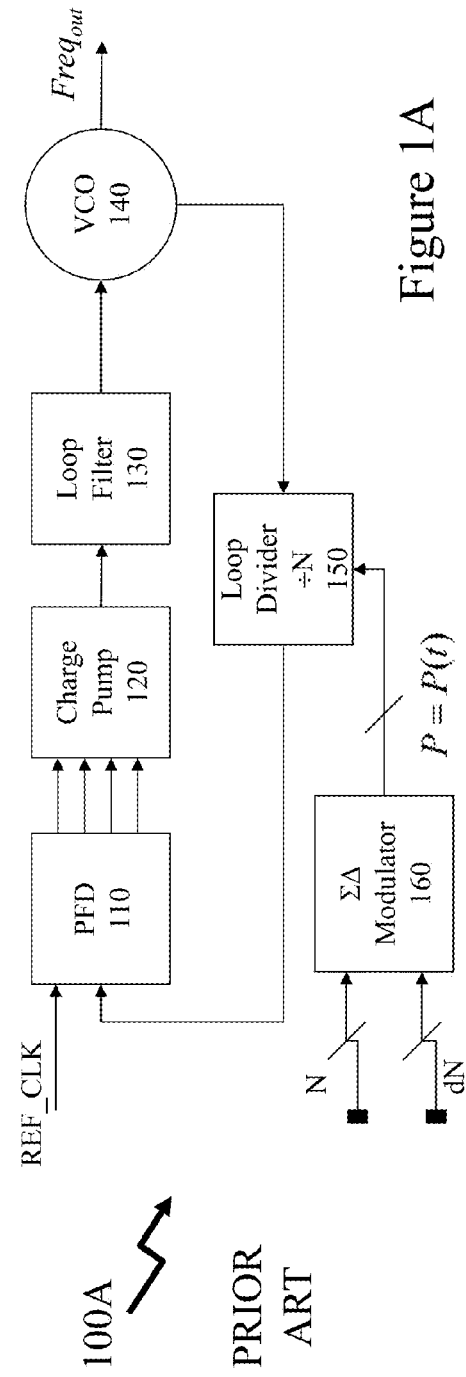
FIG. 1A depicts the architecture of a phase locked-loop (PLL) based frequency synthesizer employing a frequency divider in the feedback path.

Referring to FIG. 1A there is a generalized schematic 100A of a phase locked loop (PLL) frequency synthesizer employing a voltage controlled oscillator (VCO) 140 generating an output frequency $Freq_{out}$. The VCO 140 is driven from a Charge Pump 120 circuit via a Loop Filter 130 wherein the Charge Pump 120 circuit is controlled via a Phase Frequency Detector (PFD) 110 which compares the phase of a Reference Clock (REF_CLK) coupled to it with a second frequency signal which is derived from the VCO 140 output which has been processed by a Loop Divider 150 which divides the VCO 140 output by a factor of N. Accordingly, the PFD 110 compares the phase of the divided VCO output with that of the reference clock, REF_CLK, thereby generating an output voltage in dependence of the phase offset which is then processed by the loop filter, and converted back to phase by the VCO. In the case that the PLL is locked the input and the divided output frequencies are exactly equal. By varying the divide ratio of the divider, Loop Divider 150, the PLL can synthesize a new frequency based upon the reference input while retaining the stability, accuracy, and spectral purity of the original reference. With the addition of the digital ΣΔ, Modulator 160 a stream of integers P(t), denoted by P within FIG. 1A, are provided allowing the PLL to a fraction number corresponding to the control input of the fractional-N division technique is necessary to achieve narrow channel frequency spacing resolution, see for example Riley et al in "Delta-Sigma Modulation in Fraction-N Frequency Synthesis" (IEEE J. Solid State Circuits, Vol. 28, pp 553-559).

Figure 1B:
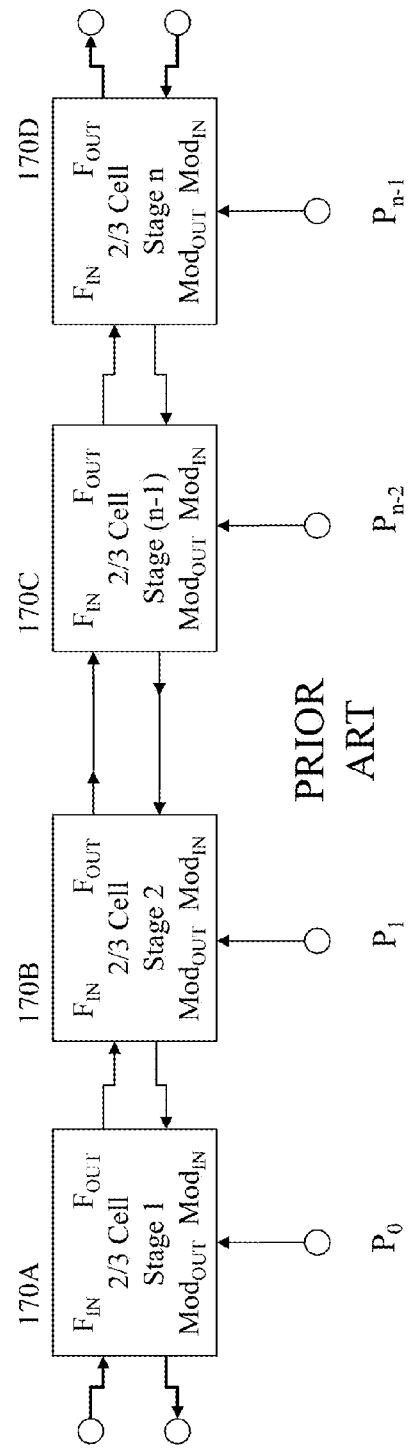
FIG. 1B depicts an architecture of a basic MMD based divider employing 2/3 cells according to the prior art.

Referring to FIG. 1B there is depicted a Multi-Modulus Divider (MMD) 100B using a plurality of 2/3 cells 170A through 170D respectively as its building block. Each of the plurality of 2/3 cells 170A through 170D respectively comprising a frequency input, $F_{IN}$, a frequency output, $F_{OUT}$, together with modulus input, $Mod_{IN}$, and modulus output, $Mod_{OUT}$. Each of the plurality of 2/3 cells 170A through 170D respectively being controlled via a control port, $P_X$, where X=0, 1, . . . , n−2, n−1. Generally, an MMD 108B consists of a chain of cascaded (P/(P+1)) divider cells connected like a ripple counter, see for example Vaucher et al in "A Wide-Band Tuning System for Fully Integrated Satellite Receivers" (IEEE J. Solid-State Circuits, Vol. 33, pp 987-997, hereinafter Vaucher4). However, the 2/3 cell, i.e. P=2 is the most widely used option within MMD 170. MMD 170 being popular as it is characterized by a simple design, just cascading divide by (P/(P+1)) divider cells where the number of these cells determines the division ratio range. Accordingly, such a cascaded (P/(P+1)) divider cell based MMD 170 is beneficial by facilitating the circuit layout work due to this modularity. Another important advantage of this structure is the absence of long delay loops, as feedback lines are only present between adjacent cells. This "local feedback" enables simple optimization of power dissipation and fast operation.

The operation of the new architecture is based on the direct relation between the desired division ratio and the bus programmed division word $P_n, P_{n-1}, P_{n-2}, P_0$ provided by the ΣΔ Modulator 160. The division ratio can be expressed as given by Equation (1).

$$N=2^n+2^{n-1}P_{n-1}+2^{n-2}P_{n-2}+\ldots+2^1P_1+2^0P_0 \quad (1)$$

Which is translated into a division range that extends from $N_{min}=2^n$ (when all P's are =0) to $N_{max}=2^{n+1}-1$ (when all P's are =1). Thus, the division range ratio can be seen to be $(N_{max}/N_{min})$ which roughly gives a factor of 2. This limited range factor is one disadvantage of the MMD approach. The division range may be extended by combining the prescaler with a set-reset counter, see for example Vaucher "An Adaptive PLL Tuning System Architecture Combining High Spectral Purity and Fast Settling Time" (IEEE J. Solid-State Circuits, Vol. 35, pp 490-502, hereinafter Vaucher2). In that case, however, the resulting architecture is no longer modular, see Vaucher1.

For example, for n=6 (i.e. a six stage MMD) we have a division range which extends from 64 to 127. Once we need a division ratio of 63 and below and/or 128 and above, this MMD system fails, and accordingly a change for the whole MMD system would be required. This is a further drawback of the MMD in that to provide for a change in the minimum and/or maximum division ratio it often leads to a change or changes in the whole architecture.

1B. The Pulse Swallow Divider

Figure 2:
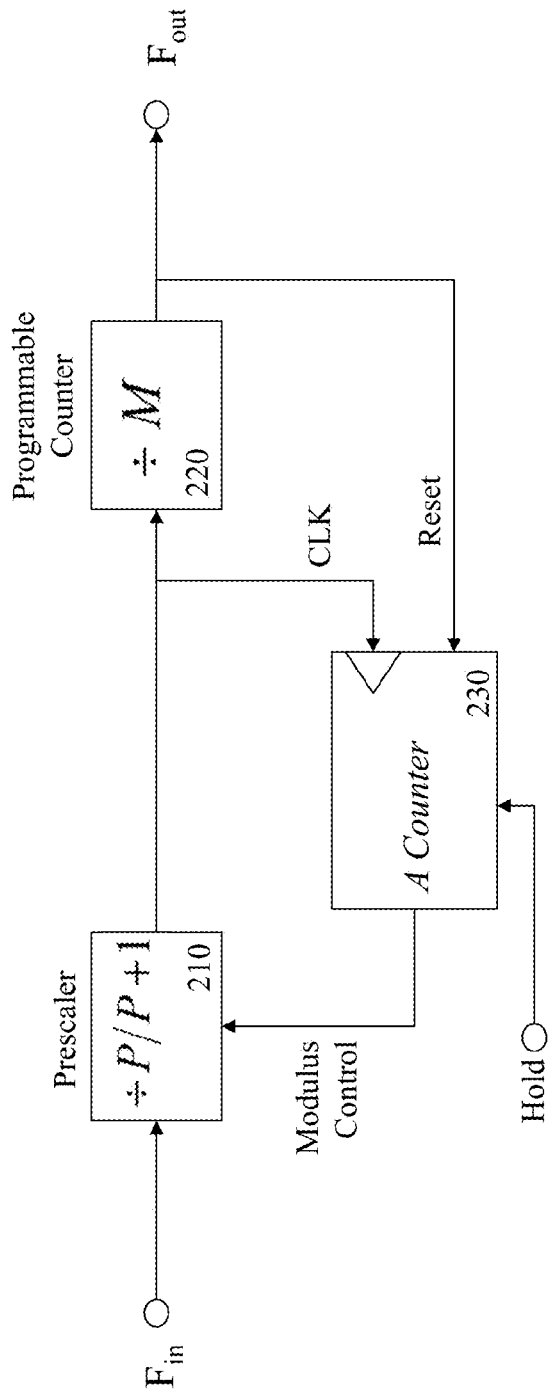
FIG. 2 depicts a PSD circuit based upon a (P/(P+1)) prescaler divider of the prior art.

Another widely used modulus divider architecture is the Pulse-Swallow Divider (PSD), which is depicted schematically in FIG. 2 by schematic 200. The Pulse-Swallow Divider includes a Programmable Frequency Divider (PFD) 220 with ratio M which divides the output of a Dual-Modulus Prescaler (DMP) 210, having modulus P and P+1, to generate the output frequency, $F_{out}$, from an input frequency, $F_{in}$. The DMP 210 output and PFD 220 are coupled to a Down Counter A 230. The DMP 210 divides by either P or P+1, depending on the value of the input Modulus Control coupled to it which is generated by the Down Counter A 230. The PFD 220 is a frequency divider with programmable division ratio M. The PFD 220 differs from the modulus divider in the sense that, once it is programmed, the division ratio remains constant. In contrast, the division ratio of a modulus divider varies dynamically based on the Modulus Control signal. Since this modulus divider is usually toggled at the VCO frequency, it requires much faster circuits than the other dividers shown in FIG. 2. This modulus divider being the Dual-Modulus Prescaler 210, so called because it directly follows the VCO, slowing down the VCO output frequency. Accordingly, the PFD 220 and Down Counter A 230 therefore do not need to operate at high speed. The PFD 220, namely the M divider, and Down Counter A 230 can as a result normally be implemented using standard digital CMOS logic techniques, whilst the VCO and the DMP 210 are normally custom designed, taking into account analog design issues, see for example Rogers et al in "Integrated Circuit Design for High-Speed Frequency Synthesis" (Artech House Microwave Library, 2006).

The operation of this PSD based divider relies on the dual modulus prescaler dividing by P+1 for A cycles and dividing by P for the remaining (M−A) cycles such that the overall dividing factor N is given by Equation (2) below.

$$N=(P-1)A+P(M-A)=P*M+A \quad (2)$$

Accordingly we can get an unlimited division range with a PSD divider as the division ratio depends on three approximately independent variables, namely M, P, and A. Another advantage of this divider is that it allows for reusability of an existing divider structure. Changing $N_{min}$ is achieved by redesigning the (P/P+1) prescaler only and changing $N_{max}$ is achieved by redesigning either the M or A counters where the equation of $N_{min}$ and $N_{max}$ are given below in Equations (3A) and (3B) respectively, see Rogers.

$$N_{min}=P(P-1) \quad (3A)$$

$$N_{max}=P*M_{max}+A_{max} \quad (3B)$$

However, the PSD architecture depicted in schematic 200 in FIG. 2 suffers from some drawbacks. One significant drawback as evident readily notices the lack of modularity of the concept, see Vaucher1 for example. Besides the dual-modulus prescaler, the architecture requires two additional counters for the generation of a given division ratio and hence suffers from long delay loops. The programmable counters, which are, in fact, fully programmable dividers, albeit not operating at the full RF frequency, represent a substantial load at the output of the dual-modulus prescaler, so that power dissipation is also increased. Accordingly, these additional design and layout efforts required for the programmable counters increase the time-to-market of new products, see Vaucher1.

1C. Multi-Modulus Divider vs. Pulse Swallow Divider

As outlined above there are benefits and drawbacks for each of the two prior art divider designs, namely Multi-Modulus Divider (MMD) and Pulse Swallow Divider (PSD), such that considering these one skilled in the art can understand where improvements should be made when establishing a new divider. The major drawback of the MMD is its limited division range ratio from a single design, which would lead one abandon the MMD with its all advantages and resort to the increased range of the PSD whilst enduring its complex design and layout together with its high power dissipation. Accordingly, if we can find a way to solve the limited range problem of the MMD then the PSD will not have any advantage over the MMD. As a first step to addressing this, Vaucher, introduced in Vaucher1 and Vaucher2 a modified MMD with extended division range as will be discussed shown in the next section.

2. Programmable Prescaler with Extended Division Range

Figure 3:
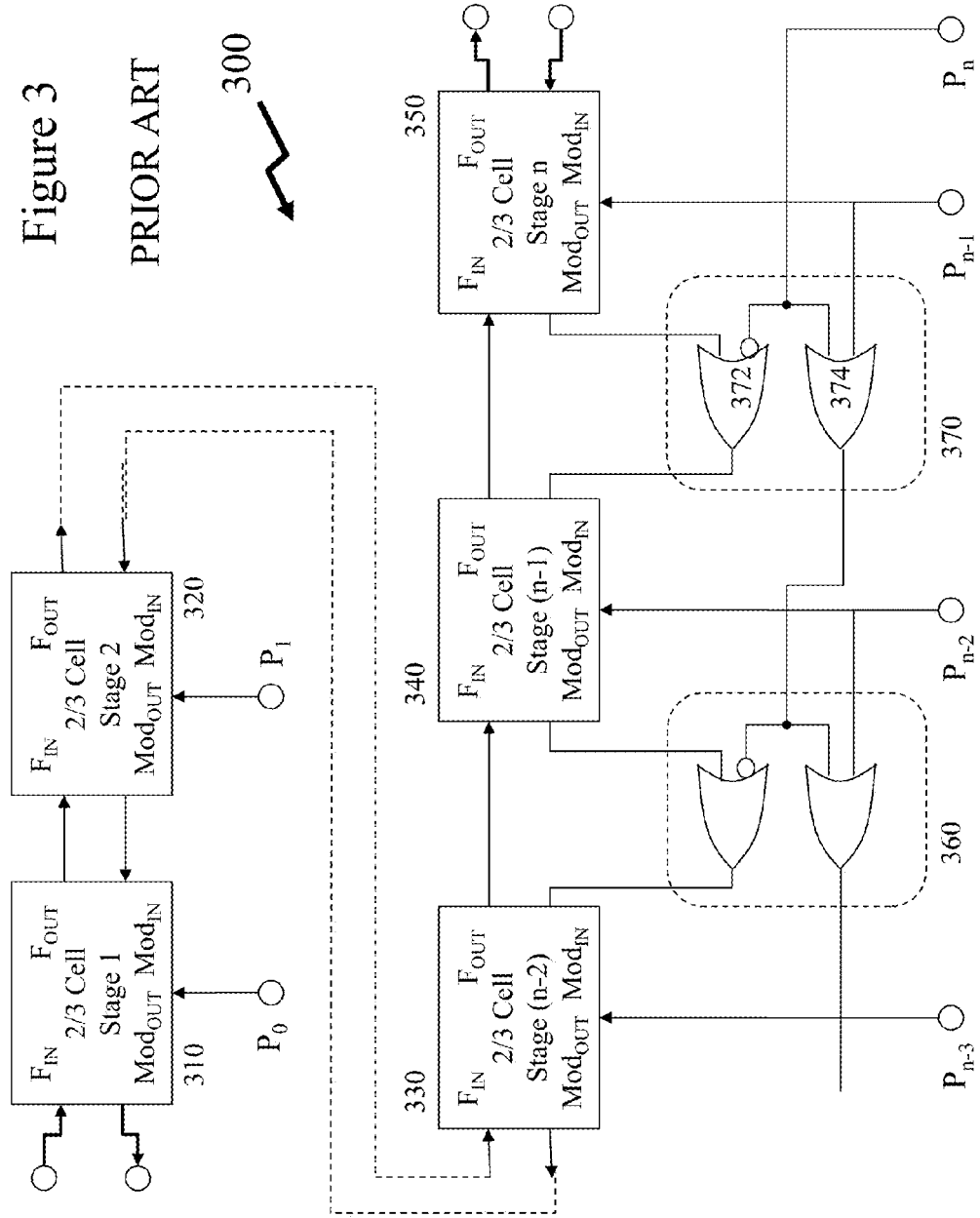
FIG. 3 depicts a programmable prescaler MMD with an extended division range according to the prior art teaching of Vaucher.
Figure 5B:
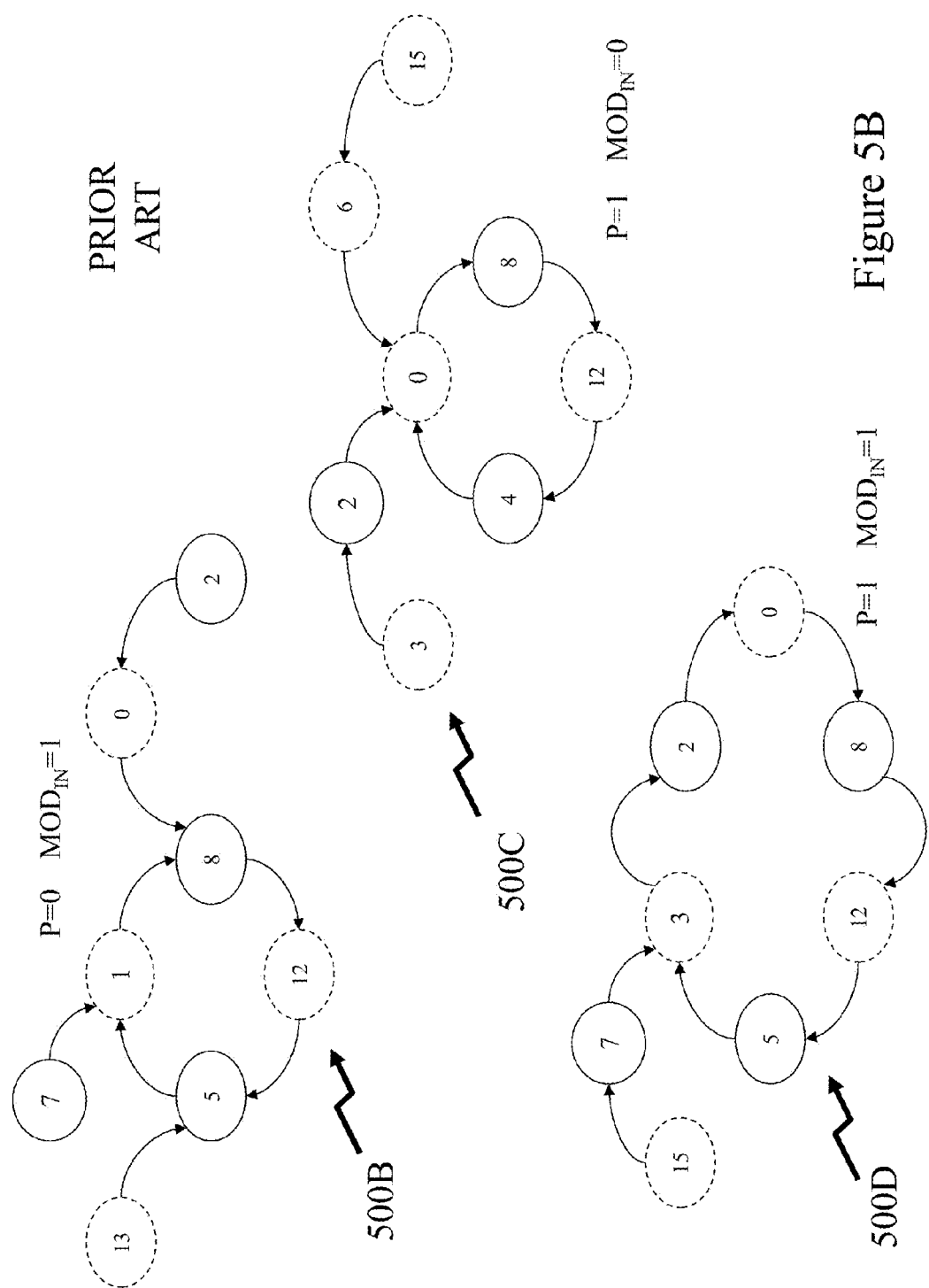

Referring to FIG. 3 there is depicted a modified MMD (Mod-MMD) 300 that operates with extended division range according to Vaucher in Vaucher1 and Vaucher2. Vaucher introduced a new concept called the effective length n' of the chain of the MMD. The effective length n' is the number of divider cells 3XX that are effectively influencing the division cycle. As depicted Mod-MMD 300 comprises a plurality of 2/3 cells 310 through 350 respectively, which can be generalized to P/(P+1), as with a MMD such as described supra in respect of FIG. 1B. Each of the plurality of 2/3 cells 310 through 350 respectively comprising a frequency input, $F_{IN}$, a frequency output, $F_{OUT}$, together with modulus input, $Mod_{IN}$, and modulus output, $Mod_{OUT}$. Each of the plurality of 2/3 cells 310 through 350 respectively being controlled via a control port, $P_X$, where X=0, 1, . . . , n−3, n−2, n−1. According to Vaucher deliberately setting the modulus input of a predetermined 2/3 cell to the active level overrules the influence of all 2/3 cells to the right of that cell, see Vaucher1 for example.

In order to achieve the desired functionality disposed between each sequential 2/3 stage Vaucher disposed logic circuits. Within Mod-MMD 300 these logic circuits are depicted by first and second blocks 360 and 370 respectively which are disposed between last/penultimate, and antepenultimate/penultimate 2/3 cells. These being depicted as 2/3 cells 350, 340, and 330 respectively. Each of the first and second logic blocks 360 and 370 respectively comprising a first logic gate 372, an OR gate, receiving the $Mod_{OUT}$ from the subsequent 2/3 cell and inverted modulus control for that subsequent 2/3 cell to generate the $Mod_{IN}$ for the preceding gate, and a second logic gate 374, another OR, receiving the modulus control for that stage as well as the output of the second logic gate within the subsequent logic gate except in the case of the last logic block which simply receives the last modulus control. Accordingly, first logic block 360 receives the modules control for penultimate 2/3 cell 340, $P_{n-2}$, the output of the second logic gate 374 in the second logic block 370, and the $Mod_{OUT}$ of penultimate 2/3 cell 340. Similarly, second logic block 370 receives the modulus control for last 2/3 cell 340, $P_{n-1}$, the $n^{th}$ modulus control, $P_n$, and the $Mod_{OUT}$ of last 2/3 cell 350.

With these additional logic blocks, the division range becomes from $2^{n'min}$ to $2^{n+1}-1$. Hence, the minimum and maximum division ratios can be set independently by the choice of n' min and n respectively. Accordingly, it would seem that the Mod-MMD of Vaucher presents a new, simple, and novel technique that solved the major problem of the MMD. However, another problem arises when this divider is used in Fractional-N PLL especially when the ΣΔ modulator drives the MMD, such as depicted in FIG. 1B, to switch back and forth between different ranges, the original range and the extended one. A wrong division ratio occurs due to errors in the path of the division cycle while switching different cells. This is outlined below in Section 3 wherein a detailed study for the logic of the 2/3 cell is presented to understand the reason of this problem and deduce the solution for it identified and implemented by the inventors according to embodiments of the invention based on the prior art of Eissa, see for example Eissa et al in "A Technique for Robust Division Ratio Switching in Multi Modulus Dividers with Modulus Extension" (Proc. $22^{nd}$ Int. Conf. Microelectronics, pp. 84-87).

3. Analysis of 2/3 Cell Logic

3A. Single 2/3 Logic Study

Referring to FIG. 4 there is depicted a single cell 400 comprising first to fourth latches 410 through 440 respectively together with first to third AND gates 450 to 470 respectively. First and second latches 410 and 420 respectively together with first AND gate 450 form Prescaler Logic 400A whilst third and fourth latches 430 and 440 respectively together with second and third AND gates 460 and 470 respectively form End-of-Cycle Logic 400B. First and fourth latches 410 and 440 respectively, denoted by L1 and L4, are transparent in that $Q_n=D_n$ whilst second and third latches 420 and 430 respectively, denoted by L2 and L3 are latched, i.e. $Q_n = D_{n-1}$ when the frequency input, $F_{in}$, is high and vice versa. As noted by Rogers it is the latches that are in the latching mode that will determine the logic of the 2/3 cell, and hence first and fourth latches 410 and 440 respectively, denoted by L1 and L4, determine the logic state of the cell when $F_{in}$ is low and when $F_{in}$ is high, second and third latches 420 and 430 respectively, denoted by L2 and L3, determine the logic state of the cell 400. Accordingly, there are eight (8) possible states, four (4) states for each $F_{in}$ level. Throughout the remainder of this specification, the state of a cell is denoted by a 4-bit binary word where each bit corresponds to a certain latch with first latch 410, L1, being the MSB and fourth latch, L4, being the LSB.

TABLE 1

All Possible States for a Cell in Detail

| State | Binary $Q_1Q_2Q_3Q_4$ | $F_{in}$ | $F_{out}$ | $Mod_{out}$ | P | $Mod_{in}$ | Prior States |
|---|---|---|---|---|---|---|---|
| 0 | 0000 | 0 | 1 | 0 | X as L3 is in transparent mode so Q3 = D3 = "0" = 4.P and while Q4 = "0" so P can be "0" or "1" | X as L4 is in latching mode so its output depends only on its previous output state so $Mod_{in}$ can be "0" or "1" | 2, 4, 6 |
|  |  | 1 | can't be as in this case L1 is in transparent mode so Q1 = D1 = QN2.QN3 = "1" ≠ "0" | | | | |
| 1 | 0001 | 0 | 1 | 1 | 0 as L3 is in transparent mode so Q3 = D3 = "0" = Q4.P and while Q4 = "1" so P must be "0" | X as L4 is in latching mode so its output depends only on its previous output state so $Mod_{in}$ can be "0" or "1" | 3, 5, 7 |
|  |  | 1 | can't be as in this case L1 is in transparent mode so Q1 = D1 = QN2.QN3 = "1" ≠ "0" | | | | |
| 2 | 0010 | 0 | can't be as L3 is in transparent mode so Q3 = D3 = Q4.P = 0.P = "0" ≠ "1" | | | | 3, 10, 11 |
|  |  | 1 | 1 | 0 | X as L3 is in latching mode so its output depends only on its previous output state so P can be "0" or "1" | X as L4 is in transparent mode so Q4 = D4 = "0" = Q2.$Mod_{in}$ and while Q2 = "0" so $Mod_{in}$ can be "0" or "1" | |
| 3 | 0011 | 0 | 1 | 1 | 1 as L3 is in transparent mode so Q3 = D3 = "1" = Q4.P and while Q4 = "1" so P must be "1" | X as L4 is in latching mode so its output depends only on its previous output state so $Mod_{in}$ can be "0" or "1" | 1, 5, 7 |
|  |  | 1 | can't be as L4 is in transparent mode so Q4 = D4 = Q2.Modin = 0.Modin = "0" ≠ "1" | | | | |
| 4 | 0100 | 0 | can't be as L2 is in transparent mode so Q2 = D2 = Q1 = "0" ≠ "1" | | | | 5, 12, 13 |
|  |  | 1 | 0 | 0 | X as L3 is in latching mode so its output depends only on its previous output state so P can be "0" or "1" | 0 as L4 is in transparent mode so Q4 = D4 = "0" = Q2.$Mod_{in}$ and while Q2 = "1" so $Mod_{in}$ must be "0" | |
| 5 | 0101 | 0 | can't be as L2 is in transparent mode so Q2 = D2 = Q1 = "0" ≠ "1" | | | | 4, 12, 13 |
|  |  | 1 | 0 | 1 | X as L3 is in latching mode so its output depends only on its previous output state so P can be "0" or "1" | 1 as L4 is in transparent mode so Q4 = D4 = "1" = Q2.$Mod_{in}$ and while Q2 = "1" so $Mod_{in}$ must be "1" | |
| 6 | 0110 | 0 | can't be as L2 is in transparent mode so Q2 = D2 = Q1 = "0" ≠ "1" | | | | 7, 14, 15 |
|  |  | 1 | 0 | 0 | X as L3 is in latching mode so its output depends only on its previous output state so P can be "0" or "1" | 0 as L4 is in transparent mode so Q4 = D4 = "0" = Q2.$Mod_{in}$ and while Q2 = "1" so $Mod_{in}$ must be "0" | |

TABLE 1-continued

All Possible States for a Cell in Detail

| State | Binary $Q_1Q_2Q_3Q_4$ | $F_{in}$ | $F_{out}$ | $Mod_{out}$ | P | $Mod_{in}$ | Prior States |
|---|---|---|---|---|---|---|---|
| 7 | 0111 | 1 | | | can't be as L2 is in transparent mode so Q2 = D2 = Q1 = "0" ≠ "1" | | 6, 14, 15 |
| | | 1 | 0 | 1 | X as L3 is in latching mode so its output depends only on its previous output state so P can be "0" or "1" | 1 as L4 is in transparent mode so Q4 = D4 = "1" = Q2. $Mod_{in}$ and while Q2 = "1" so $Mod_{in}$ must be "1" | |
| 8 | 1000 | 0 | | | can't be as L2 is in transparent mode so Q2 = D2 = Q1 = "1" ≠ "0" | | 0, 1, 9 |
| | | 1 | 1 | 0 | X as L3 is in latching mode so its output depends only on its previous output state so P can be "0" or "1" | X as L4 is in transparent mode so Q4 = D4 = "0" = Q2. $Mod_{in}$ and while Q2 = "0" so $Mod_{in}$ can be "0" or "1" | |
| 9 | 1001 | 0 | | | can't be as L2 is in transparent mode so Q2 = D2 = Q1 but Q1 = "1" & Q2 = "0" | | 9 is not a valid state |
| | | 1 | | | can't be as L4 is in transparent mode so Q4 = D4 = Q2.Modin and while Q2 = "0" the ANDing function will give "0" regardless $Mod_{in}$ value which gives Q4 = "0" not "1" | | |
| 10 | 1010 | 0 | | | can't be as L2 is in transparent mode so Q2 = D2 = Q1 but Q1 = "1" & Q2 = "0" | | 10 is not a valid state |
| | | 1 | | | can't be as L1 is in transparent mode so Q1 = D1 = QN2.QN3 = "0" ≠ "1" | | |
| 11 | 1011 | 0 | | | can't be as L2 is in transparent mode so Q2 = D2 = Q1 but Q1 = "1" & Q2 = "0" | | 11 is not a valid state |
| | | 1 | | | can't be as L1 is in transparent mode so Q1 = D1 = QN2.QN3 = "0" ≠ "1" | | |
| 12 | 1100 | 0 | 0 | 0 | X as L3 is in transparent mode so Q3 = D3 = "0" = Q4.P and while Q4 = "0" so P can be "0" or "1" | X as L4 is in latching mode so its output depends only on its previous output state so $Mod_{in}$ can be "0" or "1" | 8, 10, 14 |
| | | 1 | | | can't be as in this case L1 is in transparent mode so Q1 = D1 = QN2.QN3 = "0" ≠ "1" | | |
| 13 | 1101 | 0 | 0 | 1 | 0 as L3 is in transparent mode so Q3 = D3 = "0" = Q4.P and while Q4 = "1" so P must be "0" | X as L4 is in latching mode so its output depends only on its previous output state so $Mod_{in}$ can be "0" or "1" | 9, 11, 15 |
| | | 1 | | | can't be as in this case L1 is in transparent mode so Q1 = D1 = QN2.QN3 = "0" ≠ "1" | | |
| 14 | 1110 | 0 | | | can't be as L3 is in transparent mode so Q3 = D3 = Q4.P and while Q4 = "0" the AND function will give "0" regardless P value which gives Q4 = "0" not "1" | | 14 is not a valid state |
| | | 1 | | | can't be as L1 is in transparent mode so Q1 = D1 = QN2.QN3 = "0" ≠ "1" | | |
| 15 | 1111 | 0 | 0 | 1 | 1 | X | 9, 11, 13 |
| | | 1 | | | can't be as in this case L1 is in transparent mode so Q1 = D1 = QN2.QN3 = "0" ≠ "1" | | |

Outlined in Table I is a detailed table for all the possible states of a 2/3 cell where the reason of each value is also provided. It is important to note that the previous state is the state that guarantees the next latching state of the two latches that will be in latching mode. In other word, the previous state is the state which has latches having the same state as the state of the latches of the next state that will be in the latching mode. For example, State "0", which is in binary "0000", is a low $F_{in}$ state and hence first and fourth latches 410 and 440 respectively, L1 and L4, are in the latching mode and while Q1="0" and Q4="0", we will search for the states that have Q1 and Q4 have the same values, which are states 2, 4, 6 or in binary "0010", "0100", and "0110". Hence, each state will be preceded by at most three states. It may be less than three states due to the invalid states identified in Table 1. In Table 2 the state analysis in Table 1 is summarized after removing the invalid states.

TABLE 2

Summarized Version of Table 1

| State | Binary $Q_1Q_2Q_3Q_4$ | $F_{in}$ | $F_{out}$ | $MOD_{OUT}$ | P | $MOD_{IN}$ | Previous State |
|---|---|---|---|---|---|---|---|
| 0 | 0000 | 0 | 1 | 0 | X | X | 2, 4, 6 |
| 1 | 0001 | 0 | 1 | 1 | 0 | X | 3, 5, 7 |
| 2 | 0010 | 1 | 1 | 0 | X | X | 3 |
| 3 | 0011 | 0 | 1 | 1 | 1 | X | 1, 5, 7 |
| 4 | 0100 | 1 | 0 | 0 | X | 0 | 5, 12, 13 |
| 5 | 0101 | 1 | 0 | 1 | X | 1 | 4, 12, 13 |
| 6 | 0110 | 1 | 0 | 0 | X | 0 | 7, 15 |
| 7 | 0111 | 1 | 0 | 1 | X | 1 | 6, 15 |
| 8 | 1000 | 1 | 1 | 0 | X | X | 0, 1 |
| 12 | 1100 | 0 | 0 | 0 | X | X | 8 |
| 13 | 1101 | 0 | 0 | 1 | 0 | X | 15 |
| 15 | 1111 | 0 | 0 | 1 | 1 | X | 13 |

Now referring to Table 2, all states are ordered according to the different combinations of P and $Mod_{in}$. Tables 1 and 2 will be referred to in order to set the previous states of each state in each combination of P and $Mod_{in}$. These analyses are summarized in the first to fourth state diagrams 500A through 500D depicted in FIGS. 5A through 5D respectively. In each the low $F_{in}$ states are identified in dashed circles and the high $F_{in}$ states are identified in solid circles. As evident in each of the first to fourth state diagrams 500A through 500D each case has 8 possible states. Some of these states are only initial states that are not repeated during the division cycle, but these are however, still valid and acceptable states, and the other states form the loop of the division cycle. Now combining these first to fourth state diagrams 500A through 500D respectively, and excluding these initial states, then all the other states can be drawn in a single state diagram such as depicted in FIG. 6. Within FIG. 6 all the possible division cycles with the division ratios are indicated next to each arrow within merged state diagram 600 in FIG. 6.

3B. Two Cascaded 2/3 Cells with Modulus Extension

Now extending the analysis to the case of two cascaded 2/3 cells these results will form the basis of the generalization of the concept for n cascaded 2/3 cells. Referring to FIG. 7 a Dual Cell MMD 700 is depicted comprising first and second 2/3 cells 710 and 720 respectively which are cascaded such that in common with MMD 100B in FIG. 1B the $F_{OUT}$ of first 2/3 cell 710 provides the $F_{IN}$ of second 2/3 cell 720 whilst the modulus output $MOD_{OUT}$ of second 2/3 cell 720 provides the $MOD_{IN}$ of first 2/3 cell 710. Accordingly, taking into consideration the block diagram of the 2/3 cell depicted in FIG. 4 we obtain:

$$F_{in2} = F_{out1} = QN2_1 \quad (4)$$

$$Mod_{IN2} = 1 \quad (5)$$

$$Mod_{IN1} = Mod_{OUT2} = Q4_2 \quad (6)$$

Figure 8:
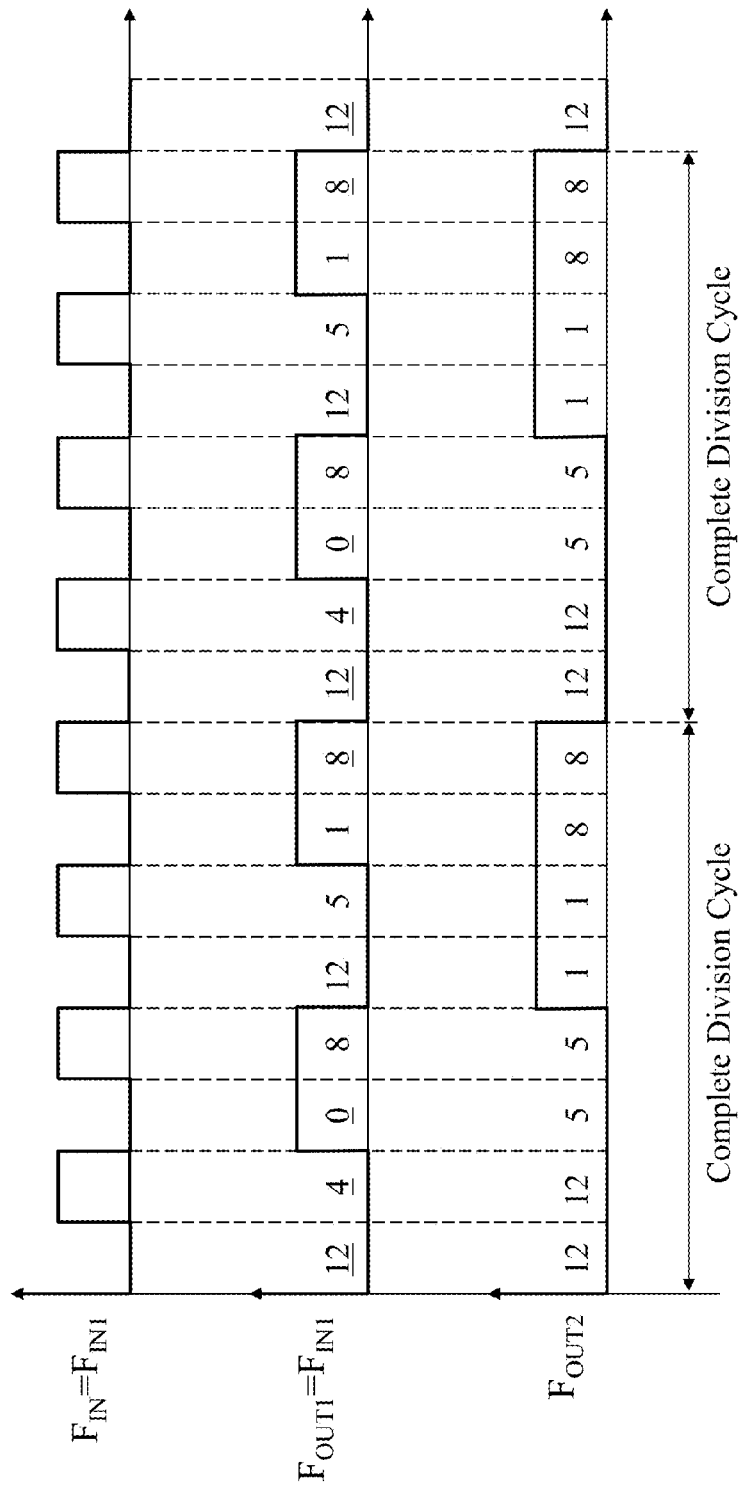
FIG. 8 depicts the timing diagram of input frequency of the cascaded 2/3 cell pair of FIG. 7 for a division of 4.
Figure 11:
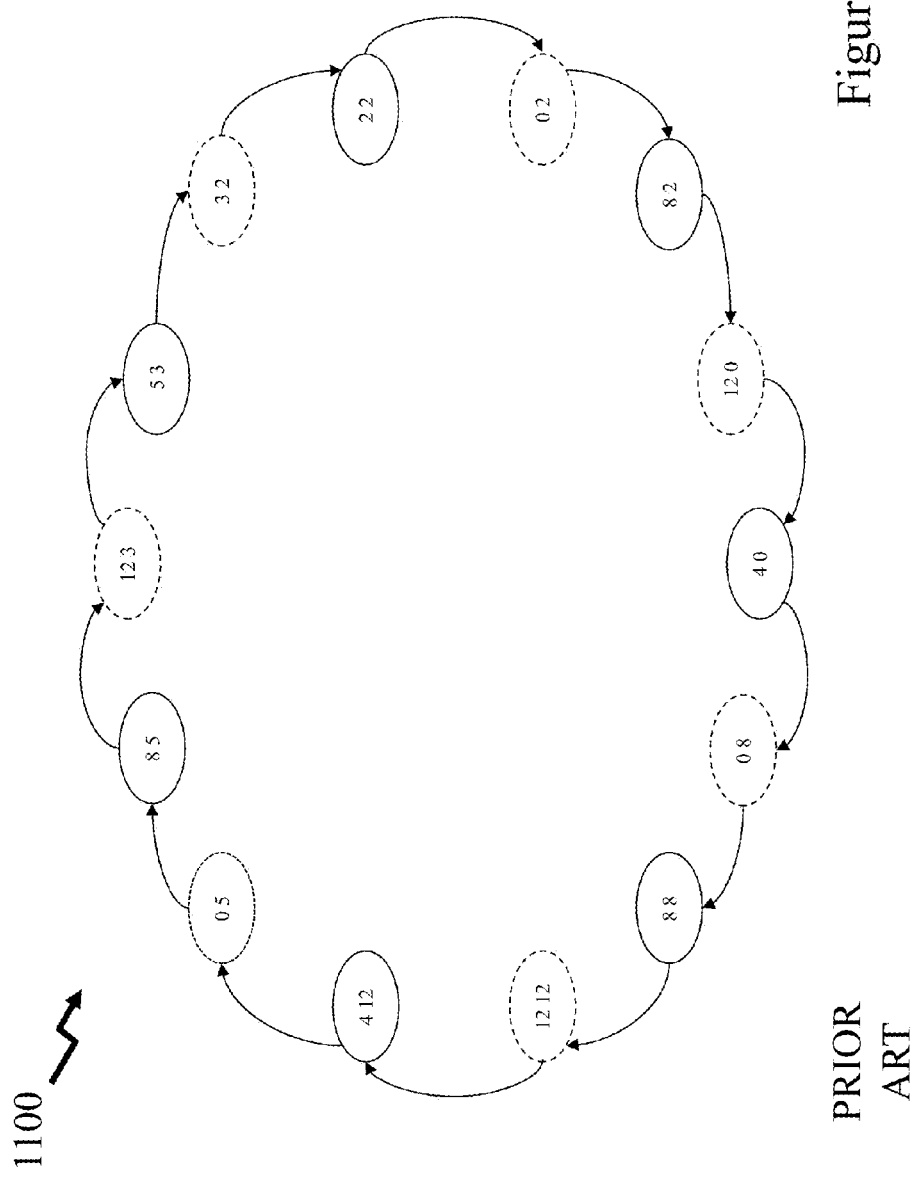
FIG. 11 depicts the state diagram for the division cycle of division ratio 7 for the cascaded 2/3 cell pair of FIG. 7.

With two 2/3 cells then the Dual Cell MMD 700 provides for division ratio ranges from 4 to 7. Considering, for example, the case of 4 and 7 to deduce their division cycle state diagrams then by using the same algorithm we will deduce the others. For a division ratio of 4 we have $P_1P_2$="00", so for stage 2 (P="0" and $Mod_{in}$="1") which means that this stage corresponds to the state diagram shown in FIG. 5B. However, for stage 1 (P="0") $Mod_{in}$ can be "0" or "1" according to the $Mod_{out}$ of stage 2 and hence this corresponds to the state diagram shown in FIG. 5A or 5B respectively. To deduce the state diagram of the 4's division cycle therefore we first draw a time diagram for this case as shown in FIG. 8 wherein it is evident that the frequency of stage 2, $F_{IN2}$, is half the frequency of stage 1, $F_{IN1}$. Second, and as an initial start, state "12" is chosen for stage 2 and as can be seen the output from stage 2 in this state is low as $Q_{2B}$="0" then from FIG. 5B we can complete the time diagram of stage 2 as can be shown in FIG. 8. For stage 2 as stated before it will toggle between the state flow diagram of FIGS. 5A and 5B according to the value of its $Mod_{in}$ signal that comes from stage 2 whether it is "0" or "1" respectively. It is also worth to mention again that $Modin_1 = Q4_2$ so we can deduce the Modin of stage 1 from the states of stage 2. As can be seen in FIG. 8 the time diagram of stage 1 is toggling between the state flow diagrams shown in FIG. 5A and FIG. 5B according to the value of its Modin signal that comes from stage 2 whether it is "0" or "1" respectively where the states at which Modin1 is "0" is distinguished from the case where Modin1 is "1" by whether it is underlined or not respectively.

For a division ratio of 7 we have $P_1P_2$="1 1", so for stage 2 (P="1" and $Mod_{in}$="1") which means that this stage corresponds to the state diagram shown in FIG. 5D. However, for stage 1 (P="1"), but $Mod_{in}$ can be "0" or "1" according to the $Mod_{out}$ of stage 2 and hence this corresponds to the state diagram shown in FIG. 5C or 5D respectively. To deduce the state diagram of the 7's division cycle, we will first draw a time diagram for this case as shown in FIG. 10. First, as shown in FIG. 10, the frequency of stage 2 is a divided version of the frequency of stage 1 by either 2 or 3 (i.e. Stage 1 divides by either 2 or 3 according to the combinations of the P and $Mod_{in}$ values and while stage 2 always divides by 3 so the whole system divides by either 6 or 9 and consequently to get an overall division of 7 the first stage will divide by 2 for two times (i.e. the two stages divide by 6) and by 3 for only one time (i.e. the two stages divide by 9) so as to get an average of 7 as described below in Equations (7A) and (7B), with reference back to Equation 2.

$$Divisor = \frac{(N_{CYCLES1} \times Divisor_{CYCLE1}) + (N_{CYCLES2} \times Divisor_{CYCLE2})}{N_{CYCLES1} + N_{CYCLES2}} \quad (7A)$$

$$Divisor = \frac{(2 \times 6) + (1 \times 9)}{3} = 7 \quad (7B)$$

Figure 12:
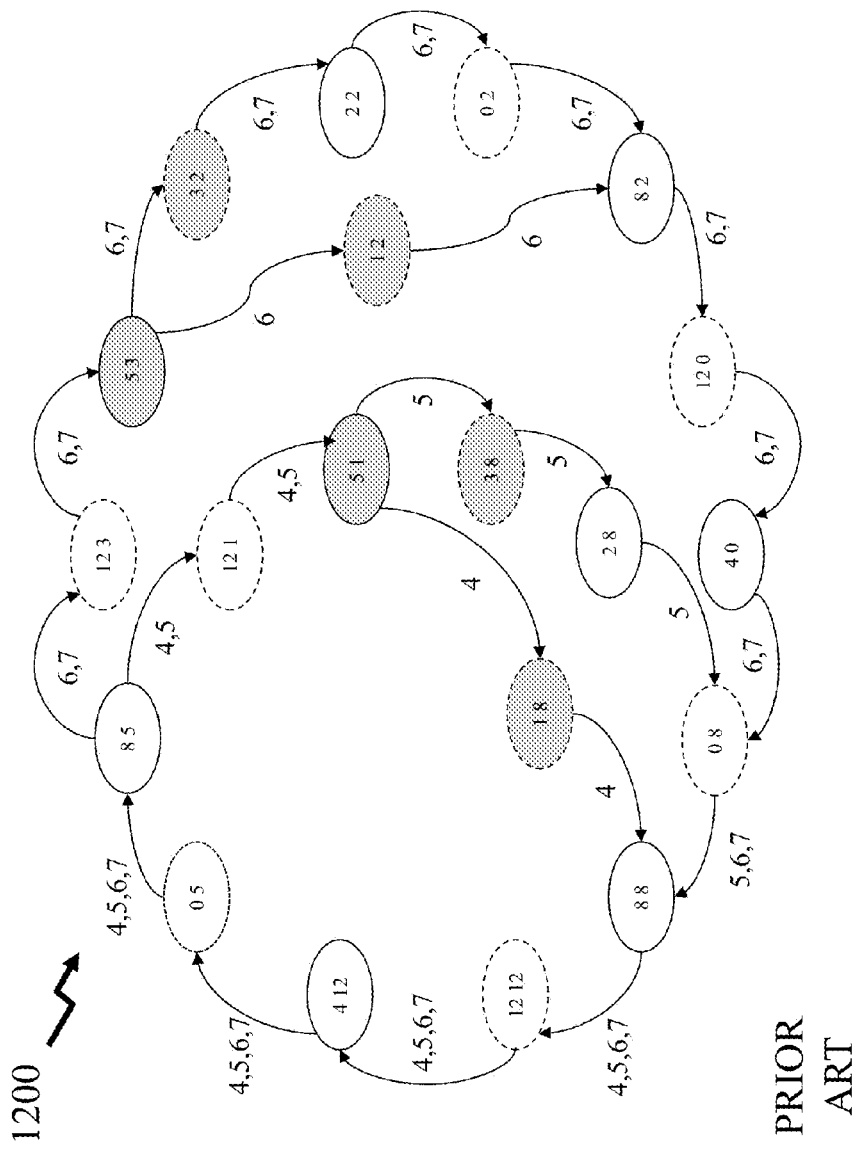
FIG. 12 depicts the state diagram for all division cycles of the cascaded pair of 2/3 cells depicted in FIG. 7 without modulus extension.

Again and as illustrated before in the case of divide by 4, stage 2 will follow the state flow diagram of FIG. 5D (As Modin2="1" and P2="1"), and we will state "12" is chosen for stage 2 and as can be seen the output from stage 2 in this state is low as Q2B="0" then from FIG. 5D we can complete the time diagram of stage 2 as can be shown in FIG. 10. For stage 2 as stated before it will translate to the state flow diagram of FIG. 5C or 5D according to the value of its Modin signal that comes from stage 2 whether it is "0" or "1" respectively and for a complete division cycle it will divide by 2 for two times (i.e. following FIG. 5C) and divide by 3 for only one time (i.e. following FIG. 5D). It is also worth to mention again that $Modin_1 = Q4_2$ so we can deduce the Modin of stage 1 from the states of stage 2. As can be seen in FIG. 10 the time diagram of stage 1 is first follow the state flow diagram of FIG. 5C when Modin1 is "0" then when Modin1 becomes "1" it follow the state flow diagram as shown in FIG. 5D then it returns back to follow the state flow diagram of FIG. 5C when Modin1 returns back to "0" as well. Also here the states at which Modin1 is "0" is distinguished from the case where Modin1 is "1" by whether it is underlined or not respectively Following the same algorithm, we can get the division cycles of the other division ratios. Accordingly, FIG. 12 depicts state diagram 1200 which depicts all division cycles of the two cascaded 2/3 cells highlighting the states at which $Mod_{out1}$ is high in light grey as an indicator to the completion of the division cycle. As with preceding state diagrams low $F_{in}$ states are identified in dashed circles and the high $F_{in}$ states are identified in solid circles.

3C. Two Cascaded 2/3 Cells with Modulus Extension

Having considered the scenario of a pair of cascaded 2/3 cells in Section 3B above then the scenario of these cascaded cells with modulus extension of the MMD is considered, such that by extending the modulus of the MMD we can extend the original range of 4-7 to a new range of 2-3 as well. This may be achieved, quite simply it seems, by forcing $Mod_{in1}$ to be "high" stage 1 of the pair of cascaded 2/3 cells will divide by either 2 or 3 according the value of $P_1$ and stage 2 of the pair of cascaded 2/3 cells will have $P_2$="0" and $Mod_{in2}$="1", but it has no effect on stage 1 in this case. However, as a result two problems are created within the pair of cascaded 2/3 cells. The first one occurs when dividing, for example, initially by 6 and the division cycle is in state (4 0) and then suddenly the division ratio changes to 2 where ($P_1$="0" and $Mod_{in1}$="1"). However, referring to FIG. 5B state 4 is not a possible state with these conditions and accordingly it will take time for the divider to move to not only a possible state but also to a state in the corresponding division cycle of 2 (i.e. states 1, 8, 12, 5). This results in the problem that the division is delayed.

Figure 13A:
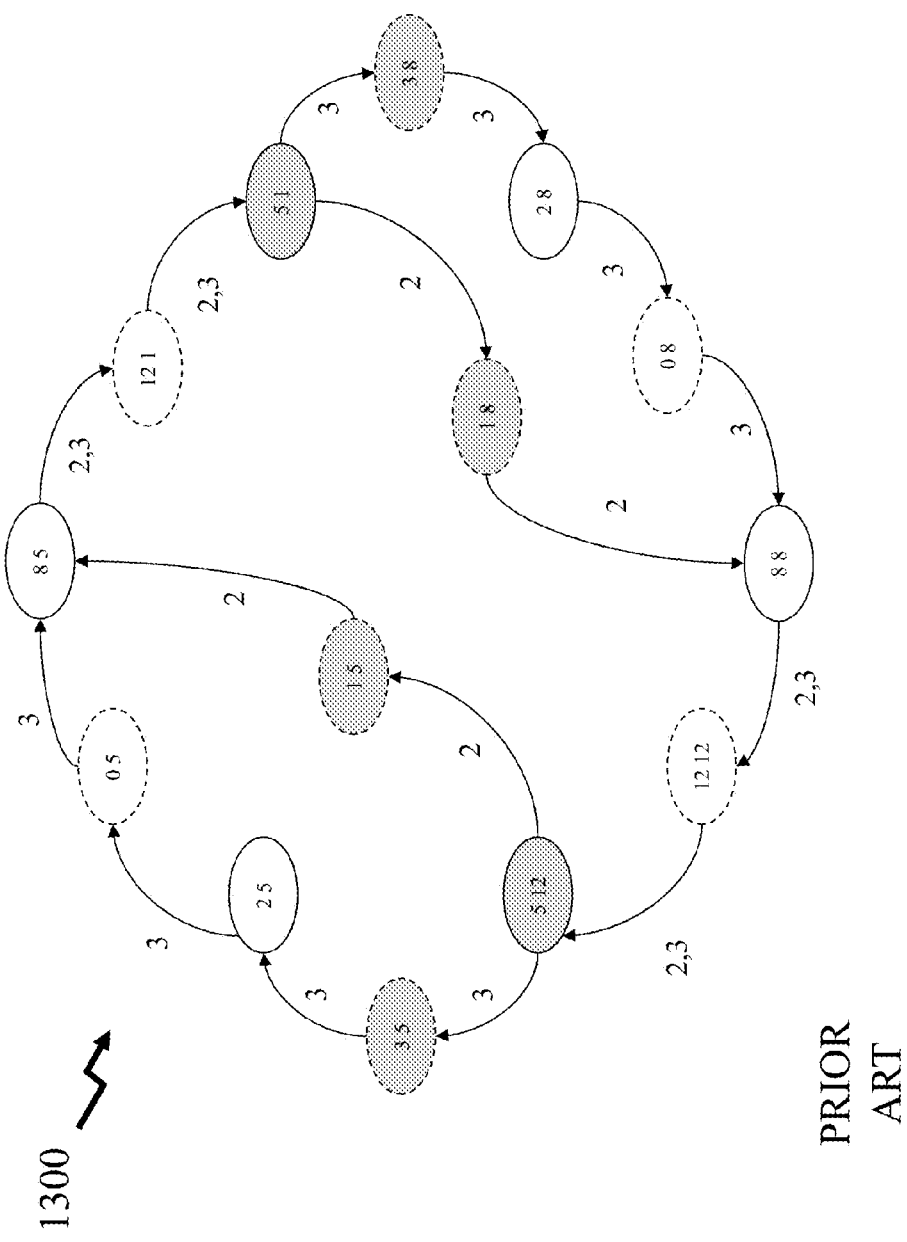
FIG. 13A depicts the state diagram of the cascaded pair of 2/3 cells depicted in FIG. 7 under modulus extension.
Figure 13B:
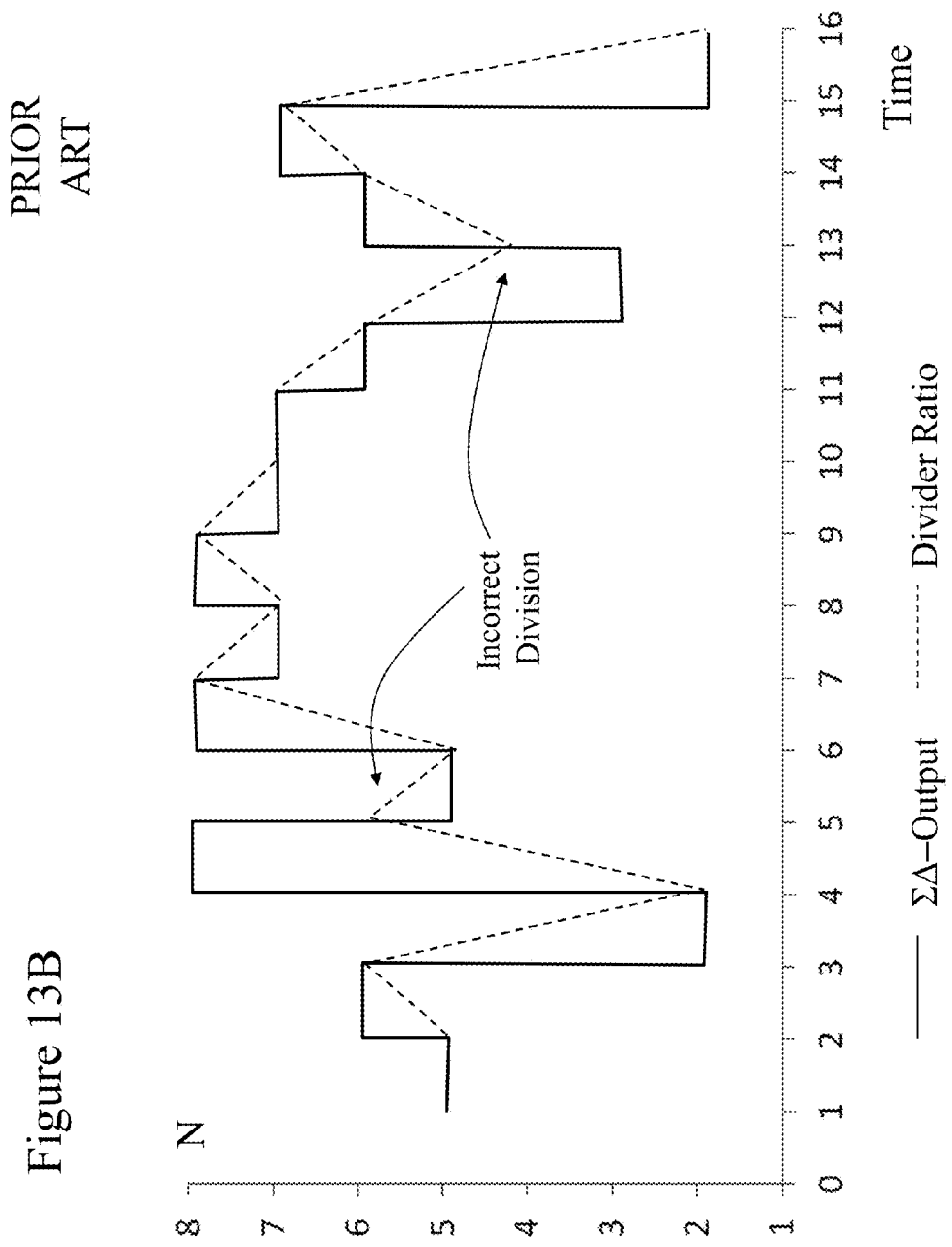
FIG. 13B depicts the unsuccessful operation of the 2 stage MMD exploiting the cascaded pair of 2/3 cells under modulus extension.

The second problem as shown in FIG. 13A is that where the states of the second stage are repeated after the first two division cycles of the first stage and not the one division cycle as it should be then this results in an incorrect division being applied. As an example of this FIG. 13B depicts the unsuccessful operation of the two stage MMD during modulus extension across the boundary wherein incorrect divisions are applied at time indices 5 and 13.

Figure 14A:
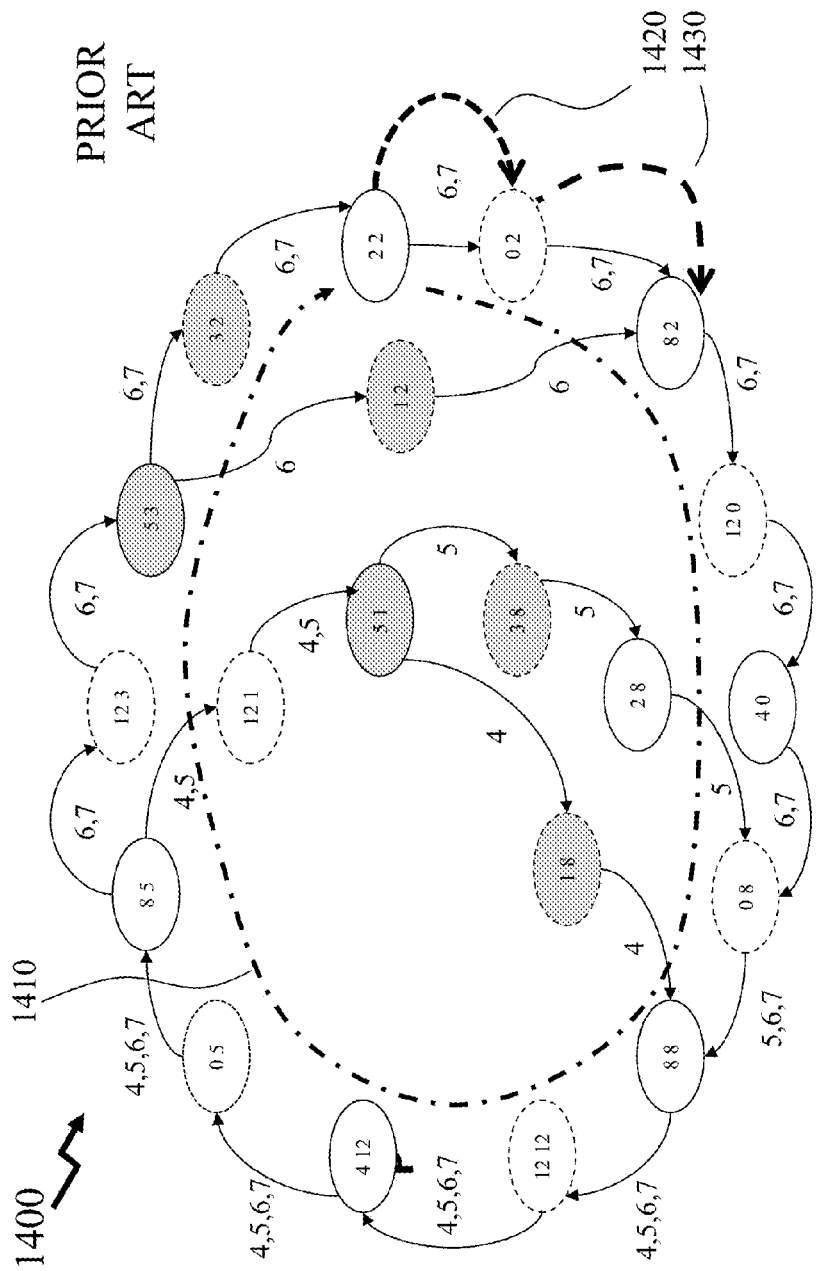
FIG. 14A depicts the state diagram of the cascaded pair of 2/3 cells depicted in FIG. 7 under modulus extension where the division ratio changes from 7 to 2.

Similarly, consider that we initially need to divide by 7. The resulting division cycle is then depicted by state sequence 1400 in FIG. 14A wherein the state cycle sequence is depicted by cycle flow 1410. Now consider that the division ratio is to be changed to 2, from the current set division of 2. The problem here is that the cycle flow 1410 has ended with a state, (2 2), which is not one of the division-by-2 cycle states and accordingly it will take the divider additional cycle steps, denoted as first and second extra cycle steps 1420 and 1430 respectively, for the state sequence 1400 to translate from the current state, (2 2), to another state which is one of the division-by-2 cycle states, in this example (8 2). This causes an error in the division process at the end and accordingly in this example it will divide by 3 due to the extra two half cycles to reach state (8 2). As evident from FIG. 14B there are multiple instances of incorrect divisions arising from changes in division ratio across the boundary between ranges.

In "A Technique for Robust Division Ratio Switching in Multi Modulus Dividers with Modulus Extension" (22nd Int. Conf. Microelectronics, October 2010, pp. 84-87) Eissa et al introduced a preliminary solution to the problem where they searched for a golden state, as they called it, with which they can trigger the ΣΔ modulator. According to Eissa this golden state should satisfy the following criteria:

this state should be a common state between all the division cycles of all the division ratios to use it as the switching point between all these division cycles; and the $Mod_{out1}$ signal should come after the same number of cycles of the input frequency of the divider for all different division cycles, not as shown in FIG. 13.

Figure 15:
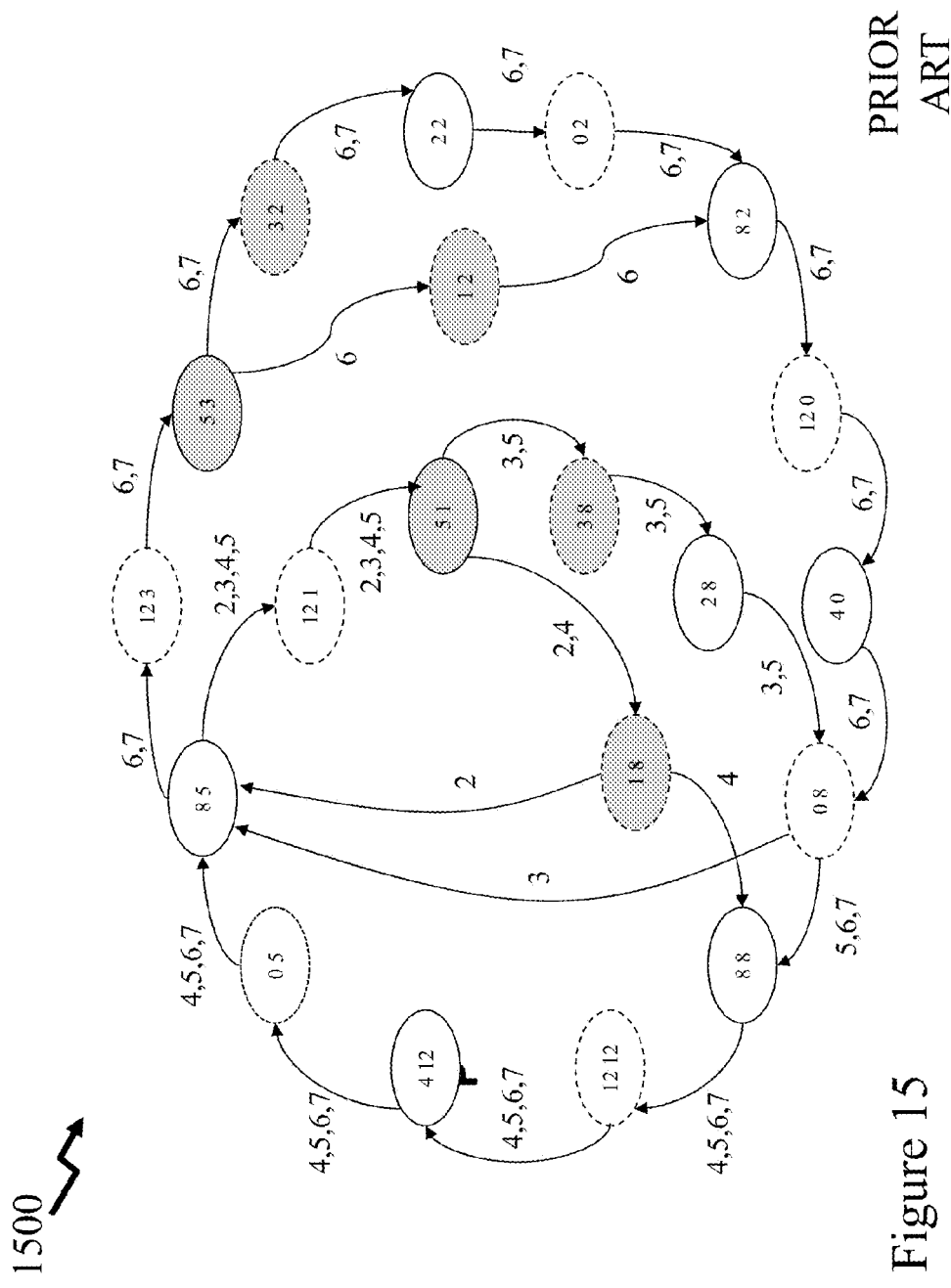
FIG. 15 depicts the state diagram for all division cycles of the cascaded pair of 2/3 cells with modulus extension.
Figure 16:
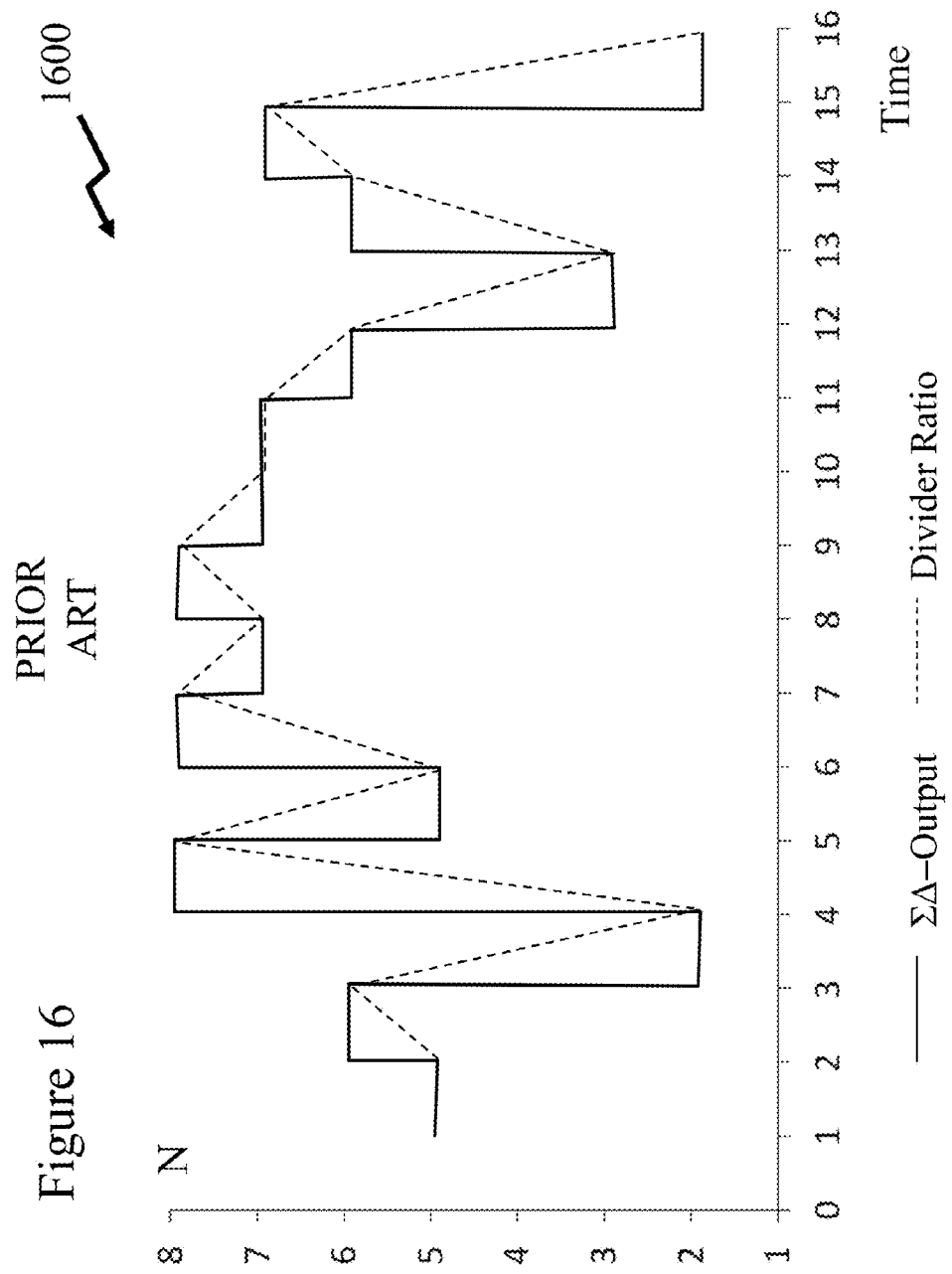
FIG. 16 depicts the successful operation of the MMD as discussed in respect of FIG. 15.

Referring to FIG. 12 it can be seen that state (8 5) is that golden state. Accordingly, a key point in a solution exploiting the golden state is to freeze the second stage at state 5 whenever the divider translates to a lower division range. Although we essentially do not care about the state of the second stage once we translate to the first stage, according to the prior art of Eissa they freeze stage 2 at state 5 such that whenever the divider returns back to the higher division range and stage 2 is unfrozen then it starts the division cycle from the same state that it was last left within when transitioning to the lower range. In FIG. 15 the state diagram 1500 for all division cycles from 2 to 7 are depicted showing that state (8 5) sits on the division cycle for all divisions of 2, 3, 4, 5, 6, and 7. Accordingly, if this freezing of state 5 is employed then we should obtain the results depicted in FIG. 16 wherein it can be seen that we should obtain successful operation of two stages MMD during modulus extension across the boundary.

However, this methodology raises a series of questions that have to answered:

how can we freeze the last stage at state 5?

how can we detect state (8 5) arising from the n−1 and n stages?

what should the action be whenever we detect this state?

Figure 17:
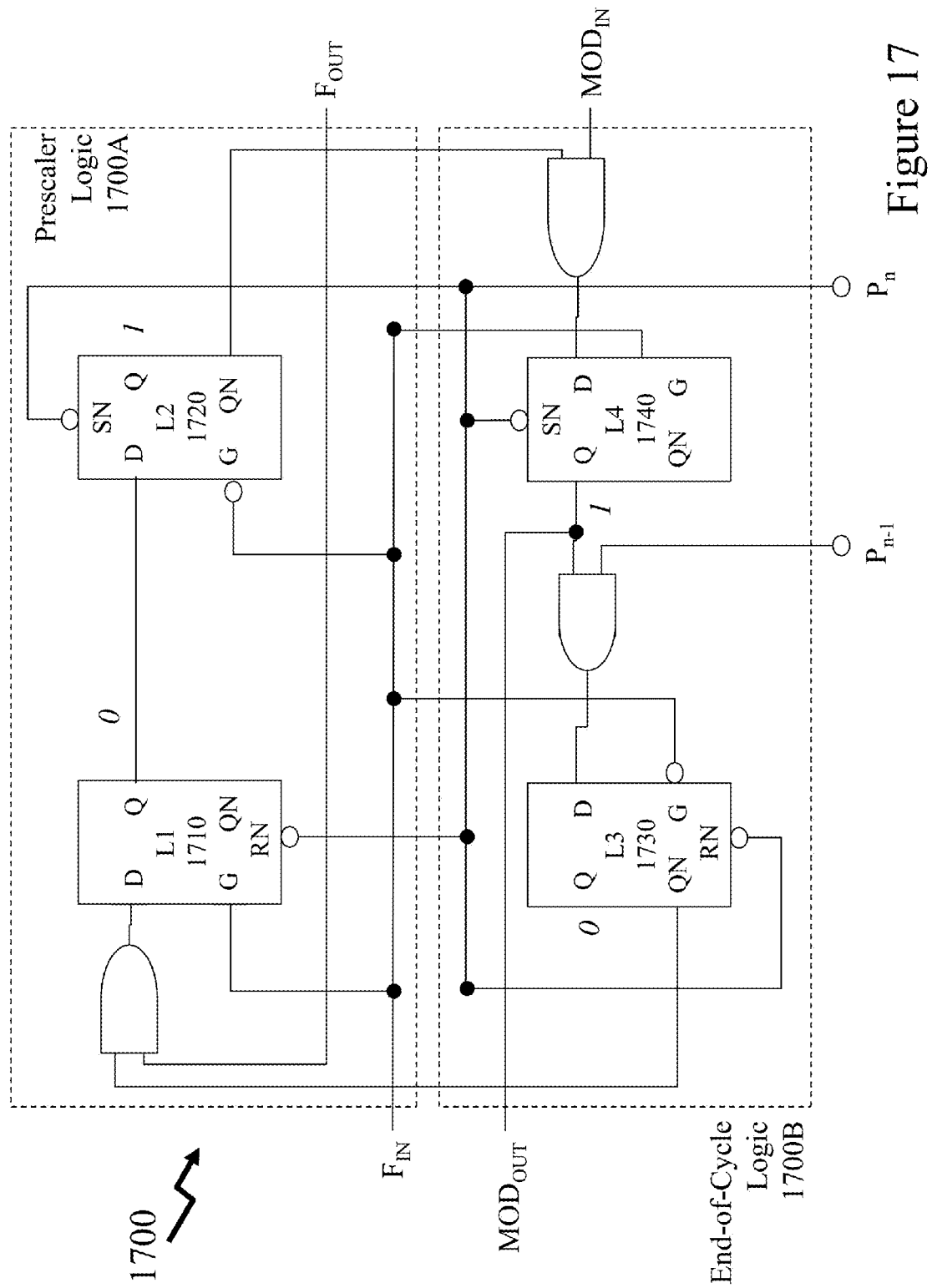
FIG. 17 depicts a modified 2/3 cell with set and reset capabilities to freeze the 2/3 cell as discussed in respect of FIGS. 15 and 16.

Considering initially how to freeze the last stage at state 5 then the inventors, using the same algorithm of Eissa, have established an approach exploiting latches within the 2/3 cell with set and reset capabilities as depicted by cell schematic 1700 FIG. 17. As with single cell 400 in FIG. 4 there are depicted first to fourth latches 1710 to 1740 respectively wherein the first and second latches 1710 and 1720 respectively form Prescaler Logic 1700A and third and fourth latches 1730 and 1740 respectively form End-of-Cycle Logic 1700B. First and third latches 1710 and 1730 respectively now additionally comprise reset pins RN whilst second and fourth latches 1720 and 1740 respectively now comprise additionally set pins SN. These set and reset pins SN and RN respectively are controlled through $P_n$. Note that these set and reset pins SN and RN respectively invert the logic of $P_n$ and hence if $P_n$ is high they are set logically low and hence have no effect on the first to fourth latches 1710 to 1740 respectively and 2/3 cell works normally. However, once $P_n$ is low it activates the set and reset pins SN and RN respectively and the P/(P+1) cell is frozen in its state, i.e. state 5.

The detection of the (8 5) state is relatively straight-forward in that we seek to detect the state 5 from the $n^{th}$ stage and the state 8 from the $(n-1)^{th}$ stage. Accordingly, an AND gate for each state gives high once its inputs, which are the outputs of the cell latches, form the combination of state 5 or 8. Then, by another AND gate we can detect the state (8 5). Once this state is detected then it can be employed to provide the clock that triggers the ΣΔ modulator and the Reload Registers to start the division cycle each time from this state. In this manner the second and third questions are addressed. Now referring to FIG. 18 there is depicted an Enhanced MMD 1800 exploiting these three answers using n stages of a 2/3 cell, labelled as cells 1810 through 1850 respectively. Within the final stage 1850 a state 5 output is now provided to the AND gate 1860 whilst within the penultimate stage 1840 a state 8 output is now provided to the AND gate 1860 such that the output of the AND gate 1860 is coupled to both the ΣΔ modulator and Reload Register. Accordingly in FIG. 18 Enhanced MMD 1800 provides a solution to the ability to extend the last two stages, penultimate stage 1840 and final stage 1850, without errors occurring from divisions that cross the boundary between these stages. It is worth mentioning that the ΣΔ, modulator and Reload Registers, which are not depicted for clarity, are now negative edge triggered as it is the negative edge of the golden state that guarantees robust operation of the divider over the entire division range for all division cycles, see Eissa for example. It is worth noting that Enhanced MMD 1800 removes the requirements for the OR Note that there is now no need for the first and second logic blocks 360 and 370 respectively depicted in Mod-MMD 300 employing OR gates in order to extend the range as the latches with their set/reset capabilities are such that when $P_n$ is low, i.e. during the extension, it sets the fourth latch 1740, L4 and hence Q4 when Mod$_{outn}$ is high.

The inventors have shown that extending, i.e. doubling, the range of the MMD, as taught by Eissa, can be achieved without incorrect divisions during transitions across the range boundary and hence solving one of the drawbacks of the MMD solution. However, this approach is still insufficient for the MMD when it is intended to be used over a wider range of division ratios. Accordingly, by adopting the prior art approach of Eissa and establishing decision and control circuits according to embodiments of the invention in FIGS. 17 and 18 that there is no complete solution for providing an MMD with unlimited range of division ratios that does not induce incorrect divisions during modulus extension.

4. Unlimited Range Continuous

Figure 18:
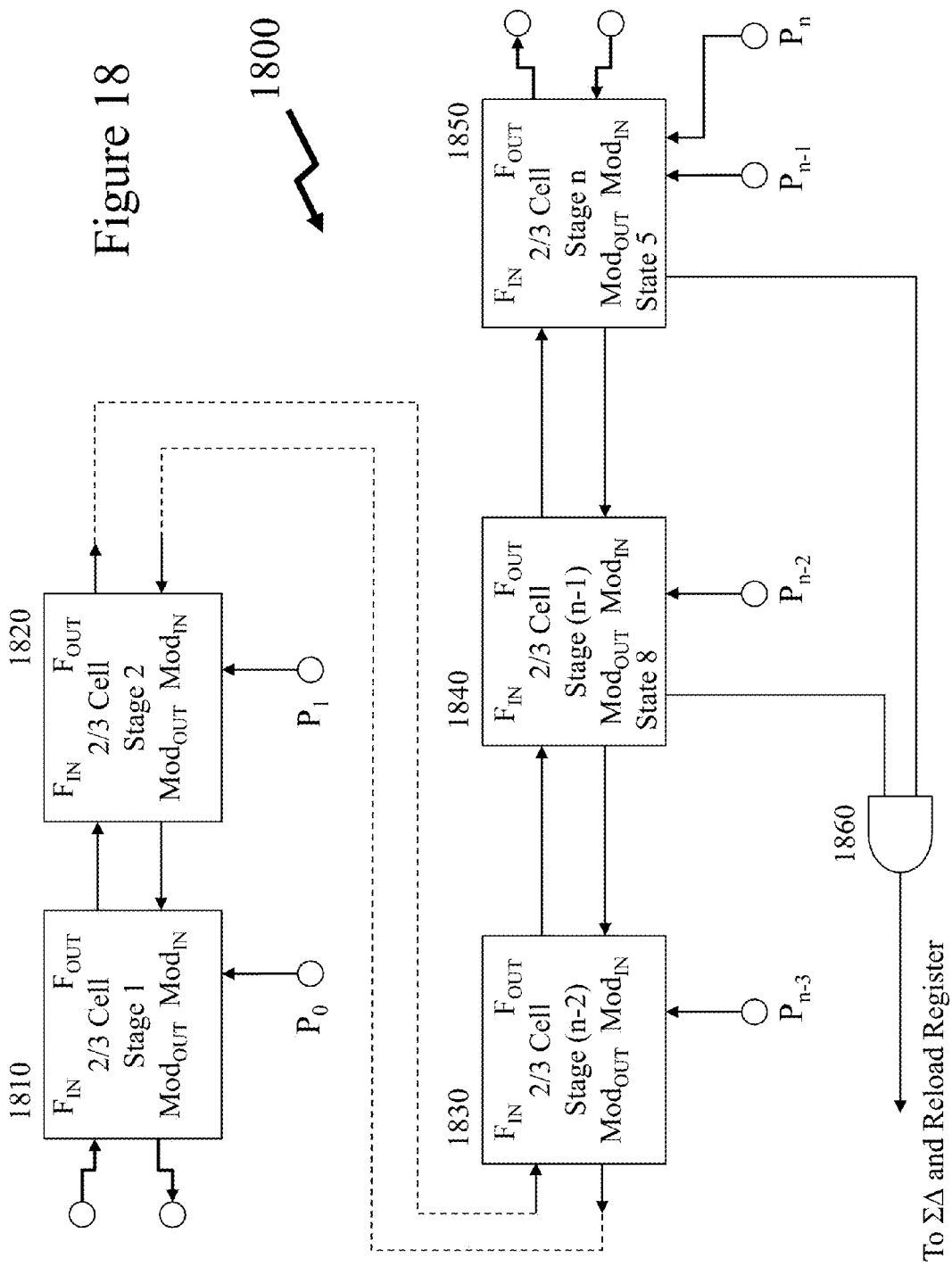
FIG. 18 depicts a modified n-stage MMD with selected freezing/unfreezing of the last and penultimate 2/3 cells and triggering for the $\Sigma\Delta$ modulator and reload registers.

Within the descriptions supra in respect of FIGS. 1B through 18 the inventors have described, using their nomenclature, an evolution from an initial limited range non-continuous MMD, MMD 100B in FIG. 1B, to an unlimited non-continuous MMD, Mod-MMD 300 in FIG. 3, to an unlimited pseudo-continuous MMD, 1800 in FIG. 18. However, an unlimited continuous MMD has not been achieved exploiting and extending upon the prior art MMD techniques. However, the inventors have established through the characteristic features of the multi-stage MMD with its modularity a methodology which enables them to map the results deduced for just two stages to a design methodology that works for any number of stages, n, such that correct operation of the divider is achieved for division changes across multiple boundaries thereby yielding a true unlimited continuous MMD, which the inventors refer to a as a Full MMD.

4A. Unlimited Continuous MMD

Embodiments of the invention for an unlimited continuous MMD, which the inventors refer to as a Full MMD, exploit the range extension methodology of Vaucher in conjunction with the modulus division concept of Eissa, which as discussed supra have conflicting architectures, two additional simple circuit blocks referred to as Clock Activation Circuit and Range Determination Circuit, and design modifications to the inventor modified 2/3 cell depicted in cell schematic 1700 in FIG. 17. These elements will be described in respect of Full MMD 1900 in FIG. 19 which comprises first and second 2/3 cells 1910 and 1915 respectively (a first design dual modulus divider stage), together with antepenultimate, penultimate, and last stages 1920, 1925, and 1930 respectively of modified 2/3 cell design (a second design dual modulus divider stage) to form a n-stage MMD. However, according to the embodiments of the invention this n-stage MMD is combined with first to third State logic blocks 1935, 1940, and 1945 respectively with first and second MOD logic blocks 1950 and 1955 respectively, Clock Activation Circuit 1960, Range Determination Circuit 1965, and multi-input OR 1970 to form the Full MMD 1900. It would be evident to one skilled in the art that the description above is an example and that the techniques according to embodiments of the invention may be extended to all n cells of a n-stage MMD.

In respect of establishing each of these extensions to MMDs of the prior art we start from consideration of the modifications with respect to Vaucher et al in "A Low-Power Truly Modular 1.8 GHz Programmable Divider in Standard CMOS Technology" (Proc. 25th Eur. Solid-State Circuits Conf., September 1999, pp. 406-409, hereinafter Vaucher3), as well as Vaucher1, Vaucher2, and Vaucher3, by disposing between the Mod$_{OUT}$ output of an m" stage, e.g. penultimate and last stages 1925 and 1930 respectively, and the Mod$_{IN}$ input of the (m−1)$^{th}$ stage, e.g. antepenultimate and penultimate stages 1920 and 1925, logic blocks, depicted as first and second MOD logic blocks 1950 and 1955 respectively which have the same design and interconnection as described supra in respect of FIG. 3 with first and second logic blocks 360 and 370 respectively to the antepenultimate, penultimate, and last stages 1920, 1925 and 1930 respectively and inputs $P_{n-2}$, $P_{n-1}$, $P_n$.

Referring to the modulus division concept of Eissa a doubling of the range of an MMD without division errors during transitions across the modulus boundary was achieved by exploiting the concept of the golden state established by Eissa in conjunction with an inventor derived design modification to the 2/3 cell of the prior art to provide the required functionality. In order to extend the range more than the double the range of the MMD without division errors during transitions across the modulus boundary the inventors have generalized the technique presented by Eissa to work not only with the last two stages but also with any other consecutive stages according to the number of extensions required within the design to be implemented. Accordingly, the design takes into consideration that each time a stage, e.g. one of the penultimate and last stages 1925 and 1930 respectively, gives us the indication of a state 5 occurrence and its corresponding previous stage, e.g. antepenultimate and penultimate stages 1920 and 1925, gives us the indication of state 8 occurrence then using an AND gate to verify the occurrence of these two states together may be exploited to trigger the $\Sigma\Delta$ modulator and Reload Registers. Accordingly, these first to third AND gates 1935B, 1940B, and 1945B receive the indication of the state 5 occurrence from one stage of the Full MMD 1900 and the indication of the state 8 occurrence from its preceding stage of the Full MMD 1900. According to the design goal of the Full MMD 1900 then the number of stages n providing state 5 and state 8 occurrence indications may be adjusted such that all division ratios across all extensions are valid. Accordingly, this may be set to be across the entire range of the Full MMD 1900.

As evident within Full MMD 1900 each of the first to third AND gates 1935B, 1940B, and 1945B forms part of first to third State logic blocks 1935, 1940, and 1945 respectively wherein the output of each of the first to third AND gates 1935B, 1940B, and 1945B is coupled to the respective one of fourth to sixth AND gates 1935A, 1940A, and 1945A respectively wherein the second input to each of these AND gates is a clock activation signal received from Clock Activation Circuit 1960. Fourth to sixth AND gates 1935A, 1940A, and 1945A receiving CLK$_{3\_ACT}$, CLK$_{2\_ACT}$, and CLK$_{1\_ACT}$ respectively. The outputs of first to third State logic blocks 1935, 1940, and 1945 generate output signals being first to third clock signals CLK$_3$, CLK$_2$, and CLK$_1$ respectively which are all coupled to multi-input OR 1970 which generates a single clock CLK which is used to generate the trigger for the $\Sigma\Delta$ modulator and Reload Registers. Accordingly, if the clock activation signals CLK$_{3\_ACT}$, CLK$_{2\_ACT}$, and CLK$_{1\_ACT}$ received from Clock Activation Circuit 1960 are all low none of the first to third State logic blocks 1935, 1940, and 1945 respectively will generate a clock signal. Hence, when one or more clock activation signals are high the occurrence of a state 5 indication and state 8 indication from the appropriate stages of the Full MMD 1900 generate a logic high output from the AND gate they are coupled to which is then logically OR'd with the clock activation signal, now logic high, thereby generating a clock signal which triggers the CLK clock signal for resetting the ΣΔ modulator and Reload Registers.

First to third AND gates 1935B, 1940B, and 1945B are referred to as Detecting AND gates and are used with an extension. As discussed above this means that the output of each detecting AND gate will be considered the clock that triggers the ΣΔ modulator and the Reload Registers for two ranges namely the original range and the extended range. However, in this way each detecting AND gate will give a clock signal and we need to activate only one clock signal at a time. Hence, the fourth to sixth AND gates 1935A, 1940A, and 1945A respectively are added, these being referred to by the inventors as Activating AND gates. These Activating AND gates are used to activate only one clock signal and deactivate the others according to the interested range of division ratios. The activation signals (i.e. $CLK_{1\_ACT}$, $CLK_{2\_ACT}$, $CLK_{3\_ACT}$, ...) for the Activating AND gates being generated by the Clock Activation Circuit 1960, which is discussed in detail later.

In the previous section, we used $P_n$ to perform the action of freezing and releasing state 5 of the last stage during modulus extension. However, within the Full MMD 1900 the case is different. Within Full MMD 1900 where it is intended to exploit multiple extensions there is the requirement for multiple signals to freeze and release state 5 for the different 2/3 cells. Accordingly, the inventors have added a Range Determination Circuit 1965 which will be discussed in details later to generate these signals, $Range_n$. Accordingly, with these inventive modifications the inventors have removed all of the MMD drawbacks without sacrificing any of its advantages. As will become evident from the discussions on the Clock Activation Circuit 1960 and Range Determination Circuit 1965 the design of these elements maintains the modularity, simple design and layout of new MMD circuits. Accordingly, there is now no requirement for exploiting Pulse Swallow Divider designs that have many drawbacks as highlighted supra.

Figure 20:
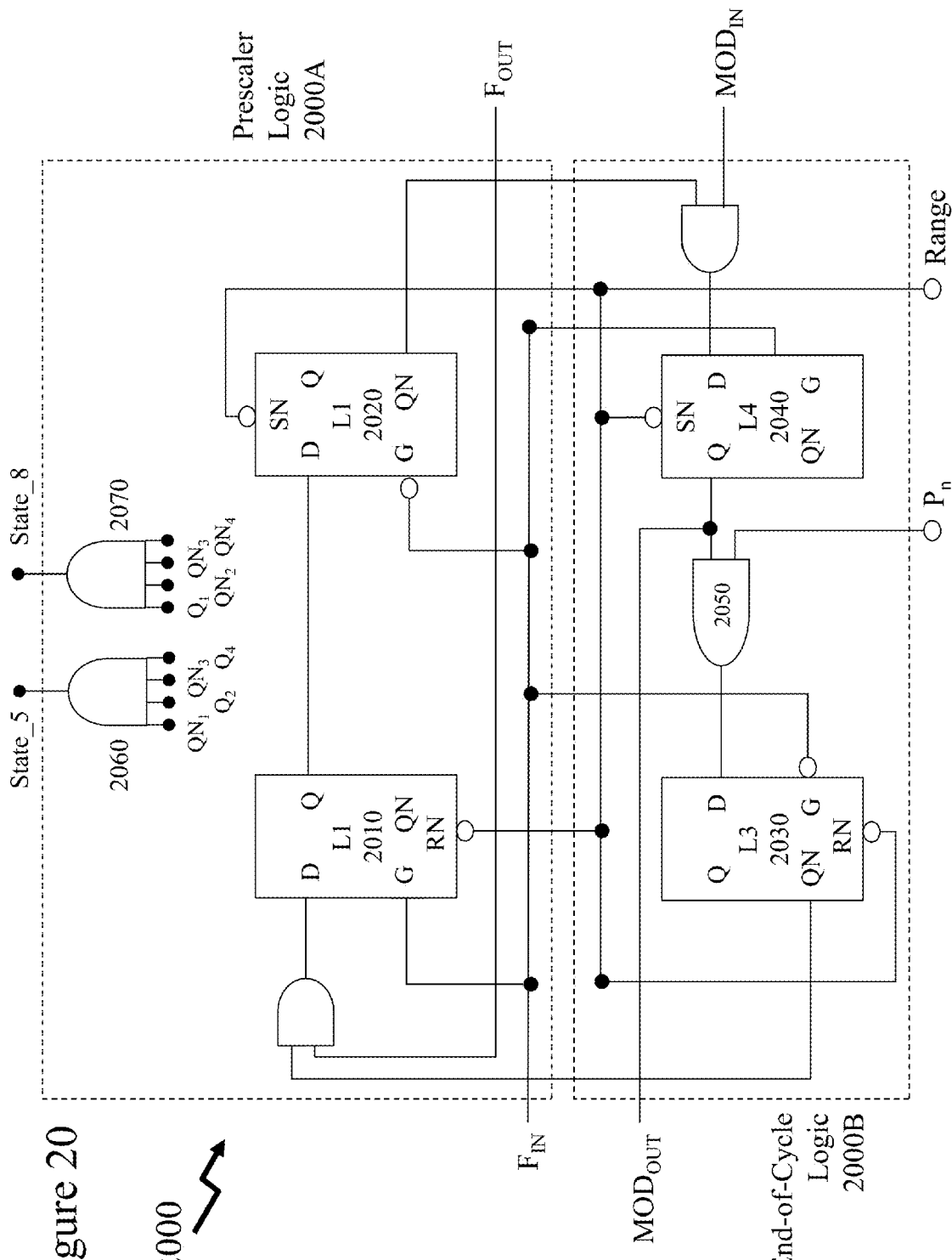
FIG. 20 depicts a 2/3 cell according to an embodiment of the invention for use within the MMD according to an embodiment of the invention described in respect of FIG. 19.

Referring to FIG. 20 there is depicted a 2/3 cell 2000 according to an embodiment of the invention for use within Full MMD 1900 to implement first to third Modified 2/3 Cells 1920, 1925, and 1930 respectively. As depicted each Modified 2/3 Cell comprises first to fourth latches 2010 to 2040 respectively wherein first and second latches 2010 and 2020 respectively form Prescaler Logic 2000A and third and fourth latches 2030 and 2040 respectively form End-of-Cycle Logic 2000B. Each Modified 2/3 Cell receives from a preceding cell within the MMD a frequency $F_{IN}$ and generates an output $F_{OUT}$ which is coupled to a subsequent cell within the MMD. The subsequent cell provides an output $MOD_{OUT}$ which is processed by a MOD logic block to generate an input $MOD_{IN}$ to the cell which then generates its own $MOD_{OUT}$ for a preceding cell. However, now Modified 2/3 Cell 1920 now receives as control signals for the Set and Reset pins SN and RN respectively the Range signal whilst the $P_n$ signal is coupled via AND gate 2050 with the Q output of the fourth latch 2040 to provide the D input to third latch 2030.

Modified 2/3 Cell 1920 also generates state 5 and state 8 occurrence indicators via first and second State AND gates 2060 and 2070 respectively. First State AND gate 2060 receives $QN_1$, $Q_2$, $QN_3$, and $Q_4$ from first to fourth latches 2010 to 2040 respectively to generate the state 5 occurrence indicator whereas second State AND gate 2070 receives $Q_1$, $QN_2$, $QN_3$, and $QN_4$ from first to fourth latches 2010 to 2040 respectively to generate the state 8 occurrence indicator.

4B. Clock Activation Circuit

Figure 19:
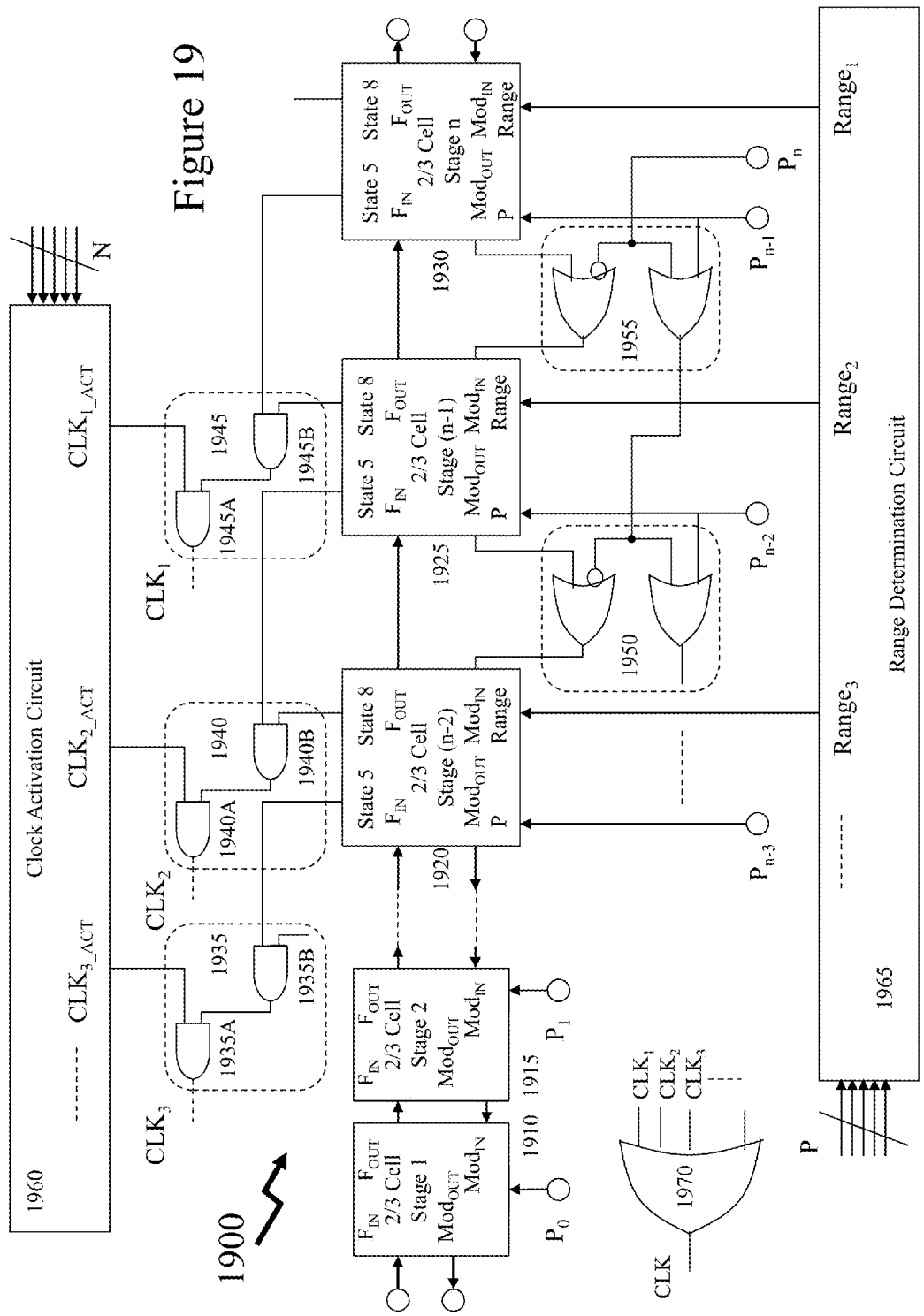
FIG. 19 depicts a MMD according to an embodiment of the invention for extended range operation and continuous division adjustment exploiting selected freezing/unfreezing together with clock activation and range determination circuits.
Figure 21:
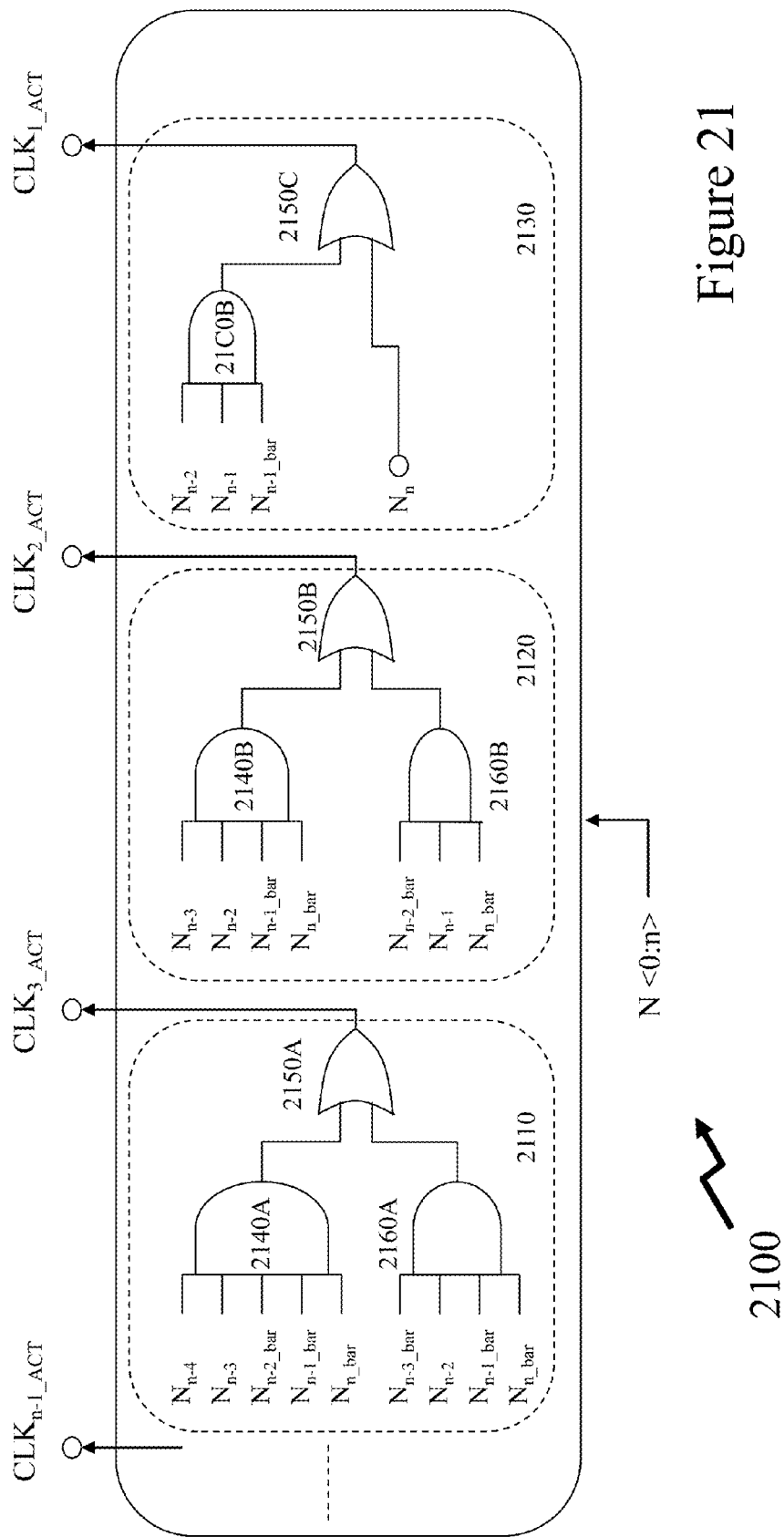
FIG. 21 depicts a clock activation circuit according to an embodiment of the invention for use within the MMD according to an embodiment of the invention described in respect of FIG. 19.
Figure 22:
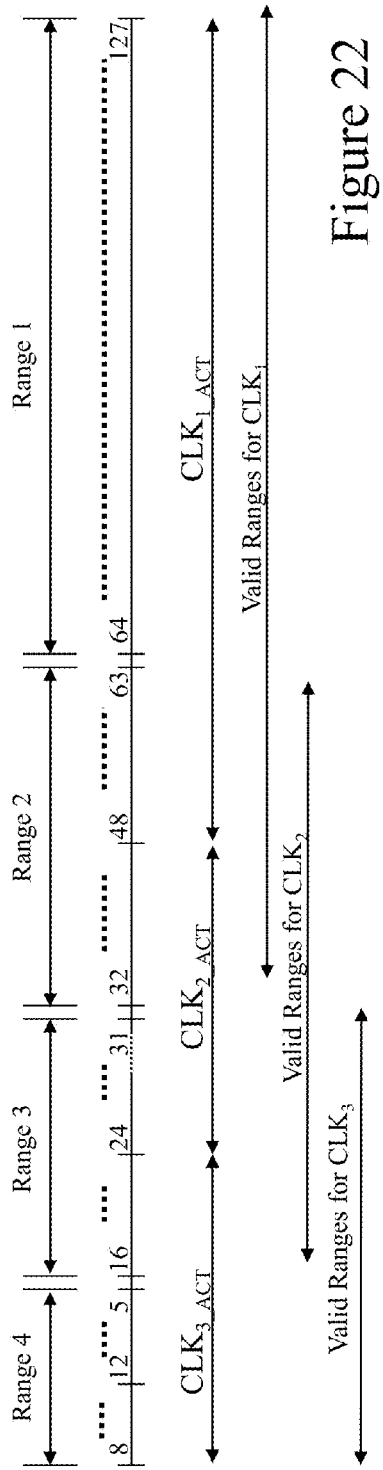
FIG. 22 depicts the function of the clock activation circuit for use within an MMD according to an embodiment of the invention described in respect of FIG. 19.

The Clock Activation Circuit, such as Clock Activation Circuit 1960 as depicted in FIG. 19, is shown as circuit schematic 2100 in FIG. 21, is used to generate the activation signals that are used to select only one clock to be outputted from the divider where only one of these signals is high and the others are low. The selection mechanism is based on dividing the ranges between these signals. In other words, when the divider is operating over just one extension, the triggering signal is used as a clock for the ΣΔ Modulator and Reload Registers, for both the original range and the extended range. However, here we have more than one extension and more than one boundary we require more than one signal. Each signal will be high for half the original range and half the extended range, then for the next signal the extended range for its previous signal will be an original range for it and it will take this other half alongside the first half range of its extended range. For example, suppose we have MMD consisting of 7 cells, i.e. it has a division range extending from 64 to 127, and we want to do 3 extensions to have 3 extra ranges, i.e. from 8 to 15, from 16 to 31, from 32 to 63, such that we have an overall division range from 8 to 127. Referring to FIG. 22 these ranges are depicted together with the associated active clock activation signals $CLK_{n\_ACT}$ from the Clock Activation Circuit 2100, depicted within Full MMD 1900 as clock Activation Circuit 1960.

Accordingly, within FIG. 22 we observe that the clock activation signal $CLK_{1\_ACT}$ covers Range 1 as an original range and covers the first half of Range 2 as an extended range. Similarly, for the next clock activation signal $CLK_{2\_ACT}$ covers the second half of Range 2 as an original range and the first half of Range 3 as an extended range. Likewise, the subsequent clock activation signal $CLK_{3\_ACT}$ covers the second half of Range 3 as an original range and Range 4 as an extended range. As would be evident to one skilled in the art the first and last ranges are covered as a whole by only one signal, i.e. Range 1 as a first range is covered by the $CLK_{1\_ACT}$ signal only, and Range 4 as the last range is covered by the $CLK_{3\_ACT}$ signal only. This is because these two ranges are not shared between two different activation signals.

As evident from Full MMD 1900 with Clock Activation Circuit 1960 and Clock Activation Circuit 2100 in FIG. 21 the input for these circuits is the fixed division ratio, i.e. the N's, and not the dynamic division ratio, i.e. the P's, that are output from the ΣΔ Modulator. This is undertaken to guarantee that during the modulus extension, only one activation signal is high and the others are low. If we use the P's as input to these clock activation circuits these P's are dynamic and are being changed during the division cycle and hence this may activate two activation signals and hence have a wrong clock signal by which the incorrect trigger is generated for the ΣΔ and the Reload Registers such that the incorrect division ratio is applied. However, the N's are fixed during the division cycle and hence these ensure robust operation of the clock activation circuit during modulus extension.

Referring to Clock Activation Circuit 2100 according to an embodiment of the invention is depicted wherein each clock activation signal $CLK_{n\_ACT}$ is generated by a hardware based decision circuit. Accordingly as depicted first to third decision circuits 2110 to 2130 respectively generate first to third clock activation signals $CLK_{3\_ACT}$, $CLK_{2\_ACT}$, and $CLK_{1\_ACT}$ respectively. Each of the first to third decision blocks 2110 to 2130 respectively comprises first AND gates 2140X, OR gates 2150X, and second AND gates 2160X, wherein as depicted X=C for the last stage of the MMD 1900, X=B for the penultimate stage, and X=A for antepenultimate stage. Also evident within Clock Activation Circuit 2100 is the trend that as the decision block gets closer to the last stage of the Full MMD 1900 the number of inputs to each of the first and second AND gates 2140X and 2160X respectively (X=A, B,C) reduces. In fact in the last stage, third decision block 2130, the inputs for the second AND gate have reduced to one such that no second AND gate is actually required. The inputs to each of the first and second AND gates 2140X and 2160X respectively (X=A,B,C) being N's. As denoted in FIG. 21 each N is of format $N_{VALUE}$ or $N_{VALUE\_BAR}$ wherein VALUE=n−4, n−3, n−2, n−1, n for example. Accordingly by way of example as depicted in FIG. 21 the second clock activation signal $CLK_{2\_ACT}$ has $N_{n-3}$, $N_{n-2}$, $N_{n-1\_bar}$, $N_{n\_bar}$ coupled to first AND gate 2140B and $N_{n-2\_bar}$, $N_{n-1}$, $N_{n\_bar}$ coupled to second AND gate 2160B wherein the outputs from these first and second AND gates 2140B and 2160B are coupled to OR gate 2150B.

4C. Range Determination Circuit

Figure 23:
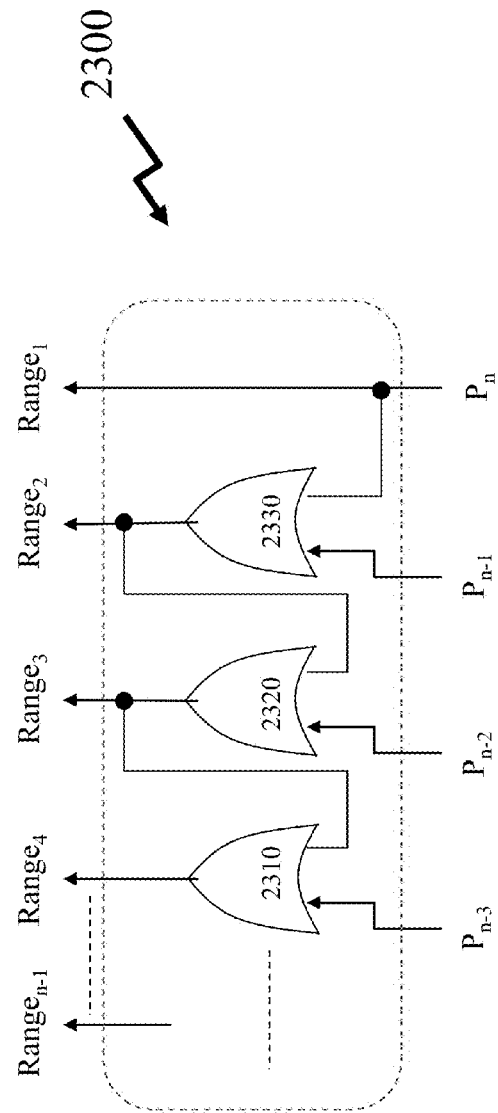
FIG. 23 depicts a range determination circuit according to an embodiment of the invention for use within the MMD according to an embodiment of the invention described in respect of FIG. 19.

The Range Determination Circuit, depicted in FIG. 19 as Range Determination Circuit 1965, is depicted in FIG. 23 as schematic 2300 is employed to generate the signals that freeze and release state 5 in each cell according to the contribution of this cell to the division process. Accordingly, the Range Determination Circuit detects the range at which the divider is working through and as a result, it generates Range's signals, $Range_{VALUE}$, which are used for the freezing or the releasing processes of state 5 in the different cells. In Eissa, for example, $P_n$ was employed to freeze state 5 for the last stage whenever the divider entered a lower range and this stage was not a part of the division cycle. Accordingly, a single pin (i.e. P) was employed to freeze the state of one stage, i.e. the last stage. However, within Full MMD 1900 there are multiple extensions and accordingly there may be multiple stages that do not influence the division operation and hence may be frozen. As a result multiple control signals will be required to freeze the different stages and it this function that the Range Determination Circuit performs.

As depicted in FIG. 23 with schematic 2300 according to an embodiment of the invention with a hardware circuit implementation consisting of an array of OR gates, depicted as first to third OR gates 2310 to 2330 respectively which generate second to fourth range control signals $Range_2$, $Range_3$, and $Range_4$ respectively. $Range_1$ is generated directly from $P_n$ whereas second range control signal $Range_2$ from third OR gate 2330 is generated by the logical OR process from $P_n$ and $P_{n-1}$. Subsequently the third and fourth range control signals and others according to the design of the Full MMD 1900 are generated by logical OR processes using the previous range control signal and the appropriate P. Hence, third range control signal $Range_3$ is based upon the logical OR process of $Range_2$ and $P_{n-2}$ and fourth range control signal $Range_4$ is based upon the logical OR process of $Range_3$ and $P_{n-3}$. Accordingly, it would be evident to one skilled in the art that the freezing taught by Eissa may be considered as a special case of the Range Determination Circuit according to embodiments of the invention, such as depicted by schematic 2300 in FIG. 23, when only a single extension is required, for example when the single extension relates to the last stage for example then $Range_s$ is generated directly from $P_n$.

In contrast to the Clock Activation Circuit described supra the Range Determination Circuit employs P's not the N's. This is because it is preferred to have the Range signals dynamic as are the P's so that during modulus extension across the boundaries the Full MMD 1900 may switch on and off a certain stage dynamically according to the different division ratios.

4D. Full MMD Performance

Figure 24:
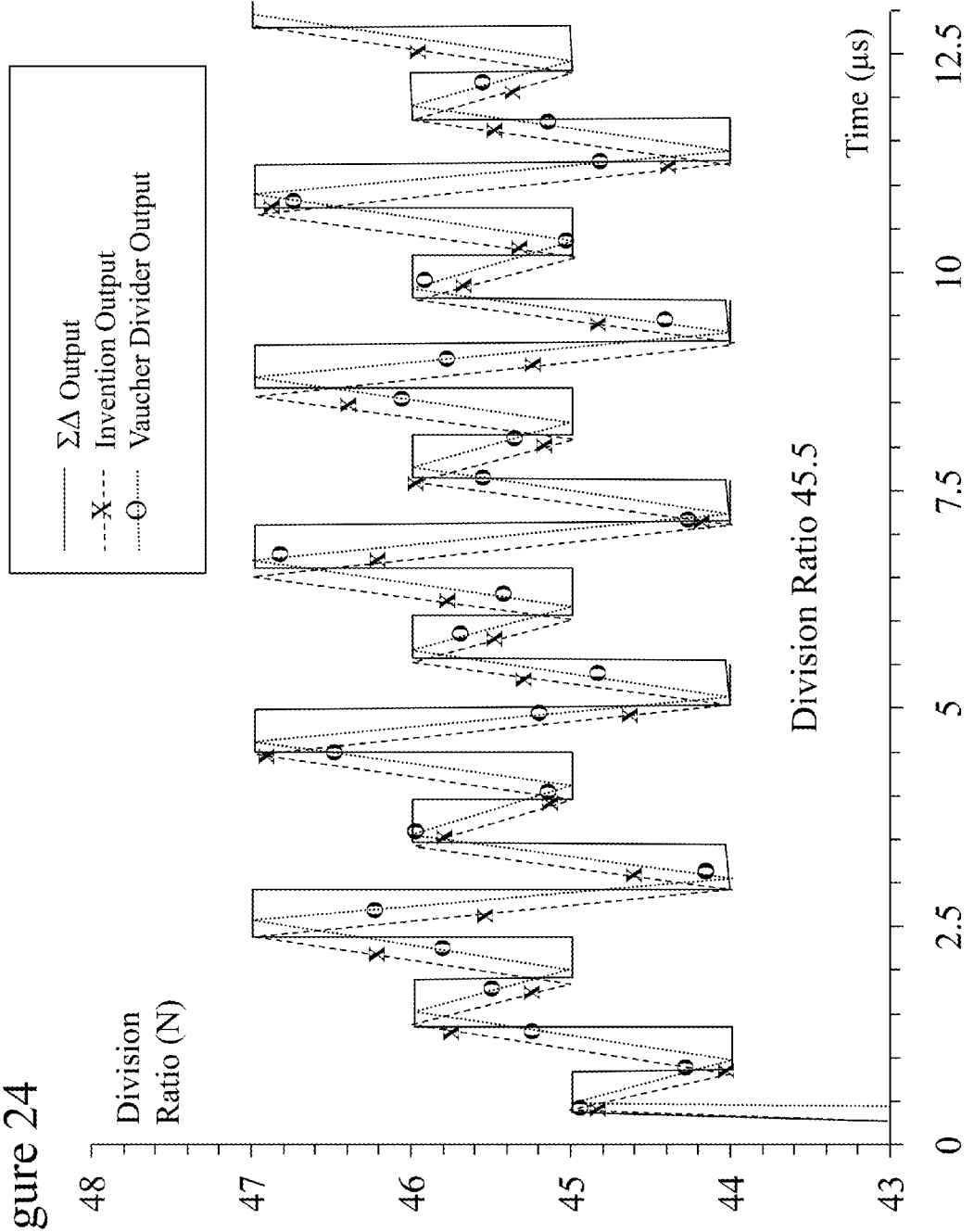
FIG. 24 depicts performance of a MMD according to an embodiment of the invention against a prior art MMD according to Vaucher for a division ratio of 45.5.

In order to verify the performance of the Full MMD according to embodiments of the invention a design example of a six stage full MMD with three modulus extensions is presented, referred to as a 6S3ME MMD. Such a 6S3ME MMD provides a division range from 8 to 127 instead of the 64 to 127 with a single modulus extension six stage MMD (6S1ME MMD) taught within the prior art. Performance of the 6S3ME MMD according to an embodiment of the invention is compared with a prior art 6S1ME MMD taught by Vaucher as using a ΣΔ Modulator. Referring to FIG. 24 the it can be see that the two divider's outputs both track the ΣΔ, Modulator output when the division ratio is $N_{SET}$=45.5, i.e. N: 42→49. This is because there is no modulus extension across the boundaries when transitioning from N=42 to N=49.

Figure 25:
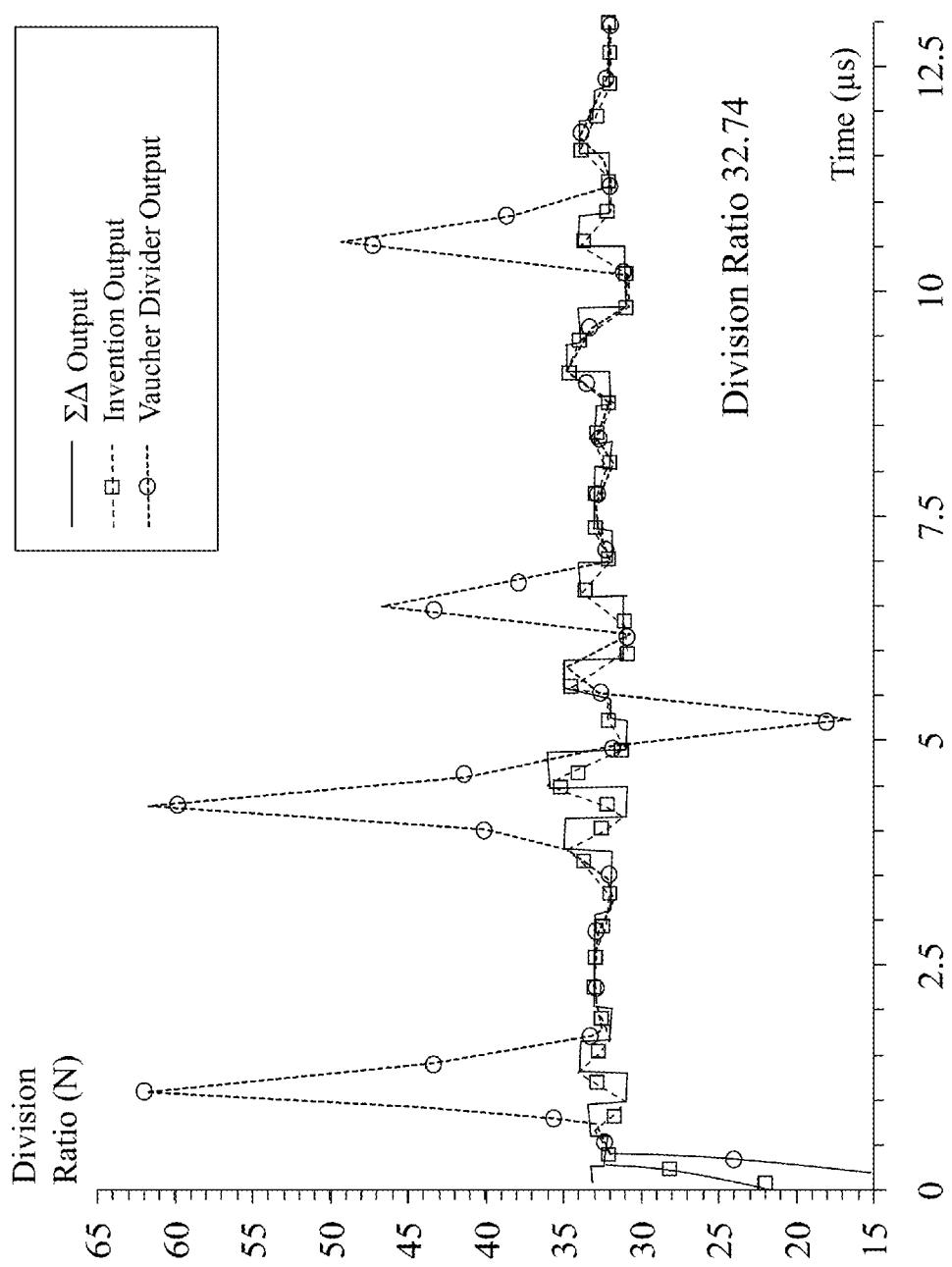
FIG. 25 depicts performance of a MMD according to an embodiment of the invention against a prior art MMD according to Vaucher for a division ratio of 32.74.

However, when modulus extension does occur as depicted in FIG. 25 where the division ratio is now $N_{SET}$=32.74, i.e. N: 29→36, then the difference between the performances of the two dividers appears as the modulus extension occurs across the boundaries when transitioning from N=29 to N=36. Accordingly, it can be seen that the Vaucher MMD (6S1E MMD) loses tracking of the ΣΔ Modulator output when it crosses the boundary between two different ranges and consequently not only generates an incorrect division ratio but the PLL loses lock due to this incorrect operation of the divider. In contrast the 6S3ME MMD according to an embodiment of the invention tracks the ΣΔ Modulator output when it crosses the boundary between two different ranges and maintains lock of the PLL.

It would be evident to one skilled in the art that the Full MMD implementation described above in respect of FIGS. 19 through 23 comprises a plurality of circuits, namely:

first dual modulus stages, such as first and second 2/3 cells 1910 and 1915 respectively in FIG. 19;

second dual modulus stages; such as antepenultimate, penultimate, and last stages 1920, 1925, and 1930 respectively of modified 2/3 cell design;

first logic blocks, such as first to third State logic blocks 1935, 1940, and 1945 respectively in FIG. 19;

second logic blocks, such as first and second MOD logic blocks 1950 and 1955 respectively;

range determination circuit, e.g. Range Determination Circuit 1965 in FIG. 19 Range Determination Circuit 2300 in FIG. 23; and clock activation circuit, e.g. Clock Activation Circuit 1960 in FIG. 19 and Clock Activation Circuit 2100 in FIG. 21.

Accordingly, it would be evident to one skilled in the art that alternate embodiments of one or more circuits described may be provided without departing from the scope of the invention. It would also be evident to one skilled in the art that the ℑ S ℵ ME MMD concept, where ℑ represents the number of stages within the multi-modulus divider (MMD) and ℵ the number of modulus extensions, allows for rapid redesign/customization including both expansion/reduction in either ℑ and/or ℵ due to the relatively straight-forward design basis of the range determination and clock activation circuits together with the replication/removal of first and second logic blocks with ℵ.

Embodiments of the invention may be implemented within a variety of hardware, firmware, and software forms according to the overall design requirements such as operating frequency range of the oscillator controlled by a PLL within which an ℑ S ℵ ME MMD according to embodiments of the invention forms part. For example, hardware implementations may be established as dedicated CMOS circuits, form part of a CMOS field programmable gate array (FPGA), and a CMOS ASIC for example. It would be evident that as the overall ℨ S ℵ ME MMD exploits essentially multiple OR gates and inverters to form the latches in combination with other AND, OR, and inverter gates to form the first and second logic blocks, 2/3 cells, 2/3 modified cells, as well as the range determination and clock activation circuits that implementations may be considered within other semiconductors as well as silicon where the requirements for performance cannot be achieved in silicon. For example Si CMOS as speed increases may be replaced with SiGe BiCMOS, or at even higher speeds GaAs MESFETs, InP BJTs, InP HBTs, and InP HEMTs. It would also be evident that different portions of the ℨ S ℵ ME MMD may be implemented within different semiconductors and/or different technologies. This may even be true within Si CMOS where different technologies may be exploited for different functional elements of the ℨ S ℵ ME MMD.

Further it would be evident that as AND and OR gates can both be implemented with NAND or NOR gate building blocks that other embodiments may be provided for part/all of the circuit elements according to the available technologies.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages and/or any combination thereof. When implemented in software, firmware, middleware, scripting language and/or microcode, the program code or code segments to perform the necessary tasks may be stored in a machine readable medium, such as a storage medium. A code segment or machine-executable instruction may represent a procedure, a function, a subprogram, a program, a routine, a subroutine, a module, a software package, a script, a class, or any combination of instructions, data structures and/or program statements. A code segment may be coupled to another code segment or a hardware circuit by passing and/or receiving information, data, arguments, parameters and/or memory contents. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor and may vary in implementation where the memory is employed in storing software codes for subsequent execution to that when the memory is employed in executing the software codes. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels and/or various other mediums capable of storing, containing or carrying instruction(s) and/or data.

The methodologies described herein are, in one or more embodiments, performable by a machine which includes one or more processors that accept code segments containing instructions. For any of the methods described herein, when the instructions are executed by the machine, the machine performs the method. Any machine capable of executing a set of instructions (sequential or otherwise) that specify actions to be taken by that machine are included. Thus, a typical machine may be exemplified by a typical processing system that includes one or more processors. Each processor may include one or more of a CPU, a graphics-processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., a liquid crystal display (LCD). If manual data entry is required, the processing system also includes an input device such as one or more of an alphanumeric input unit such as a keyboard, a pointing control device such as a mouse, and so forth.

The memory includes machine-readable code segments (e.g. software or software code) including instructions for performing, when executed by the processing system, one of more of the methods described herein. The software may reside entirely in the memory, or may also reside, completely or at least partially, within the RAM and/or within the processor during execution thereof by the computer system. Thus, the memory and the processor also constitute a system comprising machine-readable code.

In alternative embodiments, the machine operates as a standalone device or may be connected, e.g., networked to other machines, in a networked deployment, the machine may operate in the capacity of a server or a client machine in server-client network environment, or as a peer machine in a peer-to-peer or distributed network environment. The machine may be, for example, a computer, a server, a cluster of servers, a cluster of computers, a web appliance, a distributed computing environment, a cloud computing environment, or any machine capable of executing a set of instructions (sequential or otherwise) that specify actions to be taken by that machine. The term "machine" may also be taken to include any collection of machines that individually or jointly execute a set (or multiple sets) of instructions to perform any one or more of the methodologies discussed herein.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method comprising:
providing a first predetermined plurality of first dual modulus division stages, each first dual modulus division stage according to a first design supporting frequency division of a signal applied to it by proceeding through a sequence of states relating to the modulus division selected;
providing a second predetermined plurality of second dual modulus division stages, each second dual modulus division stage according to a second design supporting frequency division of a signal applied to it by proceeding through a sequence of states relating to the modulus division selected and providing a separate occurrence indication for each occurrence of at least first and second predetermined state in the sequence of states;
providing a range determination circuit for receiving a plurality of power series coefficients relating to a division factor and generating in dependence upon at least the plurality of coefficients a range signal for each second dual modulus division stage of the second predetermined plurality of second dual modulus division stages, the range signal at least one of freezing and unfreezing the second predetermined dual modulus division stage of the plurality of second dual modulus division stages;
providing between adjacent pairs of the second dual modulus division stage of the plurality of second dual modulus division stages a first logic circuit for receiving at least a predetermined coefficient of the plurality of power series coefficients and a modulus output of the second dual modulus division stage of the adjacent pair dividing the output of the other second dual modulus division stage of the adjacent pair to generate a modulus input to the other second dual modulus division stage of the adjacent pair;
providing a clock activation circuit for receiving a plurality of powers relating to a division factor and generating in dependence upon at least the plurality of powers a clock activation signal for each second dual modulus division stage of the second predetermined plurality of second dual modulus division stages except the last second dual modulus division stage of the second predetermined plurality of second dual modulus division stages;
providing between the adjacent pairs of the second dual modulus division stage of the plurality of second dual modulus division stages a second logic circuit for receiving at least a predetermined clock activation signal, the indication of an occurrence of the first predetermined state from the second dual modulus division stage of the adjacent pair dividing the output of the other second dual modulus division stage of the adjacent pair, and the indication of an occurrence of the second predetermined state from the other second dual modulus division stage of the adjacent pair to generate a clock decision of a plurality of clock decisions; and
providing a clock division circuit receiving the plurality of clock decisions to generate a control signal for at least an external circuit.

2. The method according to claim 1 wherein,
each of the first and second dual modulus division stages selectively divide by factors of 2 and 3.

3. The method according to claim 1 wherein,
providing the first predetermined plurality of first dual modulus division stages, the second predetermined plurality of second dual modulus division stages, the clock activation circuit, the range determination circuit, and the first and second logic circuits yields a multi-modulus divider operating without division errors over a predetermined division range where the predetermined division range comprises multiple ranges, each range of the multiple ranges relating a predetermined second dual modulus division stage of the second predetermined plurality of second dual modulus division stages.

4. The method according to claim 1 further comprising;
providing at least a sigma-delta (ΣΔ) modulator as the external circuit, wherein the ΣΔ modulator generates the plurality of power series coefficients, each power series coefficient being an integer.

5. The method according to claim 1 wherein,
the first and second predetermined states in the sequence of states are states 5 and 8 respectively.

6. The method according to claim 1 where,
each clock activation signal is high for a division factor range that can applied by the first predetermined plurality of first dual modulus stages and the second predetermined plurality of second dual modulus stages, the division factor range being half of a first range of division associated with a predetermined second dual modulus stage of the second predetermined plurality of second dual modulus stages and half of a second range of division associated with an adjacent second dual modulus state to the predetermined second dual modulus stage of the second predetermined plurality of second dual modulus stage.

7. A method comprising:
providing a dual modulus divider cell comprising at least four latches for generating a frequency divided output of an input signal coupled to the dual modulus divider cell and a modulus output in dependence upon at least a state of the dual modulus divider cell a modulus input signal, the state of the dual modulus divider cell being at least one of dividing by an integer N and dividing by an integer N+1, each latch of the four latches comprising at least one of a set input and a reset input in addition to the dual inputs and dual outputs;
providing a power series coefficient input to the dual modulus divider cell for controlling an aspect of the dual modulus divider cell;
providing a range input to the dual modulus divider cell, the range input being coupled to the at least one of a set input and a reset input of each of the latches;
providing a first occurrence indicator relating to a state of the dual modulus divider cell, the first occurrence indicator being generated in dependence upon a logical AND operation to a first predetermined output of each latch of the four latches; and
providing a second occurrence indicator relating to a state of the dual modulus divider cell, the first occurrence indicator being generated in dependence upon a logical AND operation to a second predetermined output of each latch of the four latches.

8. The method according to claim 7 wherein,
the power series coefficient is one of a plurality of power series coefficients, each power series coefficient being an integer.

9. The method according to claim 7 wherein,
the power series coefficient is one of a plurality of power series coefficients generated by a $\Sigma\Delta$ modulator relating to a division factor for a divider comprising at least the dual modulus divider cell, each power series coefficient being an integer.

10. A device comprising:
a first predetermined plurality of first dual modulus division stages, each first dual modulus division stage according to a first design supporting frequency division of a signal applied to it by proceeding through a sequence of states relating to the modulus division selected;
a second predetermined plurality of second dual modulus division stages, each second dual modulus division stage according to a second design supporting frequency division of a signal applied to it by proceeding through a sequence of states relating to the modulus division selected and providing a separate occurrence indication for each occurrence of at least first and second predetermined state in the sequence of states;
a range determination circuit for receiving a plurality of power series coefficients relating to a division factor and generating in dependence upon at least the plurality of coefficients a range signal for each second dual modulus division stage of the second predetermined plurality of second dual modulus division stages, the range signal at least one of freezing and unfreezing the second predetermined dual modulus division stage of the plurality of second dual modulus division stages;
a first logic circuit disposed between adjacent pairs of the second dual modulus division stage of the plurality of second dual modulus division stages, each first logic circuit for receiving at least a predetermined coefficient of the plurality of power series coefficients and a modulus output of the second dual modulus division stage of the adjacent pair dividing the output of the other second dual modulus division stage of the adjacent pair to generate a modulus input to the other second dual modulus division stage of the adjacent pair;
a clock activation circuit for receiving a plurality of powers relating to a division factor and generating in dependence upon at least the plurality of powers a clock activation signal for each second dual modulus division stage of the second predetermined plurality of second dual modulus division stages except the last second dual modulus division stage of the second predetermined plurality of second dual modulus division stages;
a second logic circuit disposed between the adjacent pairs of the second dual modulus division stage of the plurality of second dual modulus division stages, each second logic circuit for receiving at least a predetermined clock activation signal, the indication of an occurrence of the first predetermined state from the second dual modulus division stage of the adjacent pair dividing the output of the other second dual modulus division stage of the adjacent pair, and the indication of an occurrence of the second predetermined state from the other second dual modulus division stage of the adjacent pair to generate a clock decision of a plurality of clock decisions; and
a clock division circuit receiving the plurality of clock decisions to generate a control signal for at least an external circuit.

11. The device according to claim 10 wherein,
each of the first and second dual modulus division stages selectively divide by factors of 2 and 3.

12. The device according to claim 10 wherein,
the first predetermined plurality of first dual modulus division stages, the second predetermined plurality of second dual modulus division stages, the clock activation circuit, the range determination circuit, and the first and second logic circuits implement a multi-modulus divider operating without division errors over a predetermined division range where the predetermined division range comprises multiple ranges, each range of the multiple ranges relating a predetermined second dual modulus division stage of the second predetermined plurality of second dual modulus division stages.

13. The device according to claim 10 further comprising;
at least a sigma-delta ($\Sigma\Delta$) modulator as the external circuit, wherein the $\Sigma\Delta$ modulator generates the plurality of power series coefficients, each power series coefficient being an integer.

14. The method according to claim 10 wherein,
the first and second predetermined states in the sequence of states are states 5 and 8 respectively.

15. The method according to claim 10 where,
each clock activation signal is high for a division factor range that can applied by the first predetermined plurality of first dual modulus stages and the second predetermined plurality of second dual modulus stages, the division factor range being half of a first range of division associated with a predetermined second dual modulus stage of the second predetermined plurality of second dual modulus stages and half of a second range of division associated with an adjacent second dual modulus state to the predetermined second dual modulus stage of the second predetermined plurality of second dual modulus stage.

16. A device comprising:
a dual modulus divider cell comprising at least four latches for generating a frequency divided output of an input signal coupled to the dual modulus divider cell and a modulus output in dependence upon at least a state of the dual modulus divider cell a modulus input signal, the state of the dual modulus divider cell being at least one of dividing by an integer N and dividing by an integer N+1, each latch of the four latches comprising at least one of a set input and a reset input in addition to the dual inputs and dual outputs;

a power series coefficient input to the dual modulus divider cell for controlling an aspect of the dual modulus divider cell;

a range input to the dual modulus divider cell, the range input being coupled to the at least one of a set input and a reset input of each of the latches;

a first occurrence indicator relating to a state of the dual modulus divider cell, the first occurrence indicator being generated in dependence upon a logical AND operation to a first predetermined output of each latch of the four latches; and a second occurrence indicator relating to a state of the dual modulus divider cell, the first occurrence indicator being generated in dependence upon a logical AND operation to a second predetermined output of each latch of the four latches.

17. The device according to claim 16 wherein,
the power series coefficient is one of a plurality of power series coefficients, each power series coefficient being an integer.

18. The device according to claim 16 wherein,
the power series coefficient is one of a plurality of power series coefficients generated by a $\Sigma\Delta$ modulator relating to a division factor for a divider comprising at least the dual modulus divider cell, each power series coefficient being an integer.

* * * * *